United States Patent
Andrey et al.

(10) Patent No.: US 10,985,705 B2
(45) Date of Patent: Apr. 20, 2021

(54) PRE-DISTORTION PROCESSING METHOD AND APPARATUS

(71) Applicant: HUAWEI TECHNOLOGIES CO., LTD., Guangdong (CN)

(72) Inventors: Vorobyev Andrey, Moscow (RU); Yiwei Hong, Shanghai (CN); Ting Li, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/696,130

(22) Filed: Nov. 26, 2019

(65) Prior Publication Data

US 2020/0099347 A1 Mar. 26, 2020

Related U.S. Application Data

(63) Continuation of application No. PCT/CN2017/086564, filed on May 31, 2017.

(51) Int. Cl.
*H03F 1/32* (2006.01)
*H04B 1/04* (2006.01)
(Continued)

(52) U.S. Cl.
CPC ........ *H03F 1/3247* (2013.01); *H03F 1/3258* (2013.01); *H04B 1/0475* (2013.01);
(Continued)

(58) Field of Classification Search
CPC ........ H03F 1/3247; H03F 1/3258; H03F 3/68; H03F 2200/451; H03F 3/189; H03F 3/24;
(Continued)

(56) References Cited

U.S. PATENT DOCUMENTS 8,615,208 B2 * 12/2013 McCallister ......... H04B 1/0475
455/127.1
9,065,396 B2 6/2015 Son et al.
(Continued)

FOREIGN PATENT DOCUMENTS

CN 101272373 A 9/2008
CN 101594327 A 12/2009
(Continued)

OTHER PUBLICATIONS

PCT International Search Report and Written Opinion in International Application No. PCT/CN2017/086,564, dated Feb. 24, 2018, 15 pages (With English Translation).
(Continued)

*Primary Examiner* — Hieu P Nguyen
(74) *Attorney, Agent, or Firm* — Fish & Richardson P.C.

(57) ABSTRACT

The present disclosure relates to pre-distortion processing methods and apparatus. One example apparatus includes a first pre-distortion part and a second pre-distortion part. The first pre-distortion part includes N digital pre-distortion (DPD) processors. The first pre-distortion part and the second pre-distortion part perform pre-distortion processing on a signal to support a power amplifier in performing linear amplification on the signal.

20 Claims, 11 Drawing Sheets

(51) Int. Cl.
*H04B 17/336* (2015.01)
*H04L 27/36* (2006.01)

(52) U.S. Cl.
CPC ......... *H04B 17/336* (2015.01); *H04L 27/367* (2013.01); *H04B 2001/0425* (2013.01)

(58) Field of Classification Search
CPC ................ H04B 17/336; H04B 1/0475; H04B 2001/0425; H04L 27/367; H04L 25/02
USPC .................................................. 330/149, 136
See application file for complete search history.

(56) References Cited

U.S. PATENT DOCUMENTS

| | | |
|---|---|---|
| 2012/0230382 A1 | 9/2012 | Kim et al. |
| 2012/0286985 A1 | 11/2012 | Chandrasekaran et al. |

FOREIGN PATENT DOCUMENTS

| | | |
|---|---|---|
| CN | 102055411 A | 5/2011 |
| CN | 201947295 U | 8/2011 |
| CN | 201947373 U | 8/2011 |
| CN | 102763446 B | 9/2014 |
| CN | 105357157 A | 2/2016 |
| CN | 106341089 A | 1/2017 |
| CN | 106537862 A | 3/2017 |
| JP | 2002190712 A | 7/2002 |
| JP | 2006503487 A | 1/2006 |
| JP | 2011019029 | 1/2011 |
| JP | 2013046365 A | 3/2013 |
| KR | 20070116206 A | 12/2007 |

OTHER PUBLICATIONS

Huawei, Hisilicon, "Discussion on affecting factors for EVM requirement", 3GPP TSG-RAN WG4 Meeting 79, R4-163968, Nanjing, China, May 23-27, 2016, 5 pages.
Office Action issued in Chinese Application No. 201780090885.0 dated Jul. 1, 2020, 10 pages (With English Translation).
Office Action issued in Japanese Application No. 2019-566148 dated Jan. 5, 2019, 8 pages (with English translation).
Office Action issued in Korean Application No. 2019-7038000 dated Feb. 22, 2021, 19 pages (with English translation).

\* cited by examiner

PRE-DISTORTION PROCESSING METHOD AND APPARATUS

CROSS-REFERENCE TO RELATED APPLICATIONS

This application is a continuation of International Application No. PCT/CN2017/086564, filed on May 31, 2017, the disclosure of which is hereby incorporated by reference in its entirety.

TECHNICAL FIELD

This application relates to the field of communications technologies, and in particular, to a pre-distortion processing method and apparatus.

BACKGROUND

A transmit device in a wireless communications system includes a sending apparatus and antennas, and the sending apparatus is connected to the antennas. The sending apparatus includes a plurality of transmit channels, and a transmit channel includes a frequency mixer and a power amplifier (PA). One transmit channel corresponds to one antenna, and the antenna is connected to the sending apparatus. When the transmit device sends data, on a transmit channel, the sending apparatus receives a baseband signal, converts the baseband signal into a radio frequency signal by using a frequency mixer, amplifies, by using a PA, a power of the radio frequency signal to obtain an amplified radio frequency signal, and sends the amplified radio frequency signal to an antenna corresponding to the transmit channel, so that the antenna sends the amplified radio frequency signal. The sending apparatus amplifies, by using a PA, a power of a signal needing to be sent, so that a receiving device receives a satisfactory receive level, to correctly demodulate the received signal. For example, FIG. 1 is a schematic diagram of an amplification function of a PA. For the PA, a signal that is not amplified is referred to as an input signal of the PA, and an amplified signal is referred to as an output signal of the PA. As shown in FIG. 1, amplifying an input signal by the PA includes a linear area and a non-linear area. In the linear area, an amplification gain of the PA is a constant, that is, a ratio of a power of the input signal to a power of the output signal is a constant, and a phase of the input signal is the same as a phase of the output signal. In the non-linear area, amplification of the PA may be distorted, that is, an amplification gain of the PA decreases as the power of the input signal increases, and the PA even has no amplification effect. In addition, the phase of the input signal may be different from the phase of the output signal, that is, the PA may change, in the non-linear area, a property of a signal needing to be sent, affecting performance of demodulating the signal on a receive end. As a result, amplification efficiency decreases when the PA works in the non-linear area.

SUMMARY

This application provides several pre-distortion processing methods and apparatuses, to improve efficiency of a power amplifier (PA).

According to a first aspect, this application provides a pre-distortion processing apparatus, including a first pre-distortion part, a second pre-distortion part, a feedback signal conversion part, and a solving part. The first pre-distortion part includes N digital pre-distortion (DPD) processors, and is configured to: receive a first baseband signal and N sets of pre-distortion parameters, perform digital pre-distortion processing on the first baseband signal based on the N sets of pre-distortion parameters to obtain N second baseband signals, and send the N second baseband signals to the second pre-distortion part. The second pre-distortion part is configured to: receive the N second baseband signals and a network coefficient, and determine M third baseband signals based on the N second baseband signals and the network coefficient. The feedback signal conversion part is configured to: receive R radio frequency signals amplified by power amplifiers, where the R radio frequency signals amplified by the power amplifiers are radio frequency signals obtained based on the M third baseband signals; convert, into a fifth baseband signal, the R radio frequency signals amplified by the power amplifiers; and send the fifth baseband signal to the solving part. The solving part is configured to: receive the first baseband signal and the fifth baseband signal, determine the N sets of pre-distortion parameters and the network coefficient based on the first baseband signal and the fifth baseband signal, send the N sets of pre-distortion parameters to the first pre-distortion part, and send the network coefficient to the second pre-distortion part. N, M, and R are integers, N is greater than or equal to 1, M is greater than or equal to N, and R is greater than or equal to 1 and less than or equal to M. Optionally, the first baseband signal may be a service signal, or may be a signal specially used for digital pre-distortion processing. Compared with a pre-distortion processing apparatus in a conventional multi-antenna sending apparatus, according to the first pre-distortion processing apparatus provided in the embodiment of this application, a quantity of DPD processors can be reduced, to optimize a structure of the pre-distortion processing apparatus, and reduce design complexity, costs, and power consumption. Further, in the first pre-distortion processing apparatus provided in the embodiment of this application, a difference between non-linear characteristics of different PAs is considered, so that it can be ensured that signal amplification on transmit channels in a multi-antenna sending apparatus is linear.

According to the first aspect, in a first design, the first pre-distortion part specifically includes the N digital pre-distortion DPD processors. An $x^{th}$ DPD processor in the N DPD processors is configured to: receive an $x^{th}$ set of pre-distortion parameters in the N sets of pre-distortion parameters and an $x^{th}$ DPD processor input signal, perform digital pre-distortion processing on the $x^{th}$ DPD processor input signal based on the $x^{th}$ set of pre-distortion parameters to obtain an $x^{th}$ second baseband signal in the N second baseband signals, and send the $x^{th}$ second baseband signal to the second pre-distortion part, where x is an integer, and a value of x ranges from 1 to N. When x is 1, the $x^{th}$ DPD processor input signal is the first baseband signal; or when x is any one of 2 to N, the $x^{th}$ DPD processor input signal is an $(x-1)^{th}$ second baseband signal sent by an $(x-1)^{th}$ DPD processor in the N DPD processors, and the $(x-1)^{th}$ second baseband signal is an $(x-1)^{th}$ second baseband signal in the N second baseband signals. In the first design of the first aspect, the DPD processors are cascaded to perform pre-distortion processing on signals to obtain N signals on which pre-distortion processing has been performed. This implementation has a relatively simple design, relatively low costs, and relatively low power consumption.

According to the first aspect, in a second design, the first pre-distortion part specifically includes the N DPD processors and N−1 multipliers. An $x^{th}$ DPD processor in the N DPD processors is configured to: receive an $x^{th}$ set of pre-distortion parameters in the N sets of pre-distortion parameters and an $x^{th}$ DPD processor input signal in N DPD processor input signals, and perform digital pre-distortion processing on the $x^{th}$ DPD processor input signal based on the $x^{th}$ set of pre-distortion parameters to obtain an $x^{th}$ DPD processor output signal in N DPD processor output signals, where x is an integer, and a value of x ranges from 1 to N. When x is 1, the $x^{th}$ DPD processor input signal is the first baseband signal; or when x is any one of 2 to N, the $x^{th}$ DPD processor input signal is an $(x-1)^{th}$ DPD processor output signal sent by an $(x-1)^{th}$ DPD processor in the N DPD processors, and the $(x-1)^{th}$ DPD processor output signal is an $(x-1)^{th}$ DPD processor output signal in the N DPD processor output signals. A $y^{th}$ multiplier in the N−1 multipliers is configured to: receive a $y^{th}$ DPD processor output signal sent by a $y^{th}$ DPD processor in the N DPD processors and a $(y+1)^{th}$ DPD processor output signal sent by a $(y+1)^{th}$ DPD processor in the N DPD processors, multiply the $y^{th}$ DPD processor output signal by the $(y+1)^{th}$ DPD processor output signal to obtain a $y^{th}$ second baseband signal in the N second baseband signals, and send the $y^{th}$ second baseband signal to the second pre-distortion part, where the $y^{th}$ DPD processor output signal is a $y^{th}$ DPD processor output signal in the N DPD processor output signals, the $(y+1)^{th}$ DPD processor output signal is a $(y+1)^{th}$ DPD processor output signal in the N DPD processor output signals, y is an integer, and a value of y ranges from 1 to N−1. When x is N, the $x^{th}$ DPD processor output signal is an $x^{th}$ second baseband signal in the N second baseband signals, and the $x^{th}$ DPD processor is further configured to send the $x^{th}$ second baseband signal to the second pre-distortion part. In the second design of the first aspect, the DPD processors perform pre-distortion processing on signals, and the multipliers perform feedback complex multiplication on signals to obtain N signals on which pre-distortion processing has been performed. During signal amplification, this implementation intends to more effectively reduce non-linear distortion and improve amplification efficiency in a scenario in which there is significant non-linear distortion.

According to the first aspect, in a third design, the first pre-distortion part specifically includes the N DPD processors and N−1 adders. An $x^{th}$ DPD processor in the N DPD processors is configured to: receive an $x^{th}$ set of pre-distortion parameters in the N sets of pre-distortion parameters and the first baseband signal, and perform digital pre-distortion processing on the first baseband signal based on the $x^{th}$ set of pre-distortion parameters to obtain an $x^{th}$ DPD processor output signal in N DPD processor output signals, where x is an integer, and a value of x ranges from 1 to N. A $y^{th}$ adder in the N−1 adders is configured to: receive a $y^{th}$ DPD processor output signal sent by a $y^{th}$ DPD processor in the N DPD processors and a $(y+1)^{th}$ DPD processor output signal sent by a $(y+1)^{th}$ DPD processor in the N DPD processors, add the $y^{th}$ DPD processor output signal and the $(y+1)^{th}$ DPD processor output signal to obtain a $y^{th}$ second baseband signal in the N second baseband signals, and send the $y^{th}$ second baseband signal to the second pre-distortion part, where the $y^{th}$ DPD processor output signal is a $y^{th}$ DPD processor output signal in the N DPD processor output signals, the $(y+1)^{th}$ DPD processor output signal is a $(y+1)^{th}$ DPD processor output signal in the N DPD processor output signals, y is an integer, and a value of y ranges from 1 to N−1. When x is N, the $x^{th}$ DPD processor output signal is an $x^{th}$ second baseband signal in the N second baseband signals, and the $x^{th}$ DPD processor is further configured to send the $x^{th}$ second baseband signal to the second pre-distortion part.

In the third design of the first aspect, the DPD processors perform pre-distortion processing on signals, and the adders perform feedback complex adding on signals to obtain N signals on which pre-distortion processing has been performed. During signal amplification, this implementation intends to more effectively reduce non-linear distortion and improve amplification efficiency in a scenario in which there is significant non-linear distortion.

According to the first aspect, in a fourth design, the first pre-distortion part specifically includes the N DPD processors and L adders, where L is a value obtained by rounding $((N-2)/2)$ up to the next integer. An $x^{th}$ DPD processor in the N DPD processors is configured to: receive an $x^{th}$ set of pre-distortion parameters in the N sets of pre-distortion parameters and an $x^{th}$ DPD processor input signal in N DPD processor input signals, perform digital pre-distortion processing on the $x^{th}$ DPD processor input signal based on the $x^{th}$ set of pre-distortion parameters to obtain an $x^{th}$ second baseband signal in the N second baseband signals, and send the $x^{th}$ second baseband signal to the second pre-distortion part, where x is an integer, and a value of x ranges from 1 to N. A $p^{th}$ adder in the L adders is configured to: receive a $(2p-1)^{th}$ second baseband signal sent by a $(2p-1)^{th}$ DPD processor in the N DPD processors and a $2p^{th}$ second baseband signal sent by a $2p^{th}$ DPD processor in the N DPD processors, add the $(2p-1)^{th}$ second baseband signal and the $2p^{th}$ second baseband signal to obtain a $(2p+1)^{th}$ DPD processor input signal and a $(2p+2)^{th}$ DPD processor input signal in the N DPD processor input signals, and send the $(2p+1)^{th}$ DPD processor input signal and the $(2p+2)^{th}$ DPD processor input signal to a $(2p+1)^{th}$ DPD processor and a $(2p+2)^{th}$ DPD processor in the N DPD processors, where the $(2p-1)^{th}$ second baseband signal is a $(2p-1)^{th}$ second baseband signal in the N second baseband signals, the $2p^{th}$ second baseband signal is a $2p^{th}$ second baseband signal in the N second baseband signals, p is an integer, and a value of p ranges from 1 to L−1. L is a multiple of 2, and an $L^{th}$ adder in the L adders is configured to: receive a $(2L-1)^{th}$ second baseband signal sent by a $(2L-1)^{th}$ DPD processor in the N DPD processors and a $2L^{th}$ second baseband signal sent by a $2L^{th}$ DPD processor in the N DPD processors, add the $(2L-1)^{th}$ second baseband signal and the $2L^{th}$ second baseband signal to obtain a $(2L+1)^{th}$ DPD processor input signal and a $(2L+2)^{th}$ DPD processor input signal in the N DPD processor input signals, and send the $(2L+1)^{th}$ DPD processor input signal and the $(2L+2)^{th}$ DPD processor input signal to a $(2L+1)^{th}$ DPD processor and a $(2L+2)^{th}$ DPD processor in the N DPD processors; or L is not a multiple of 2, and an $L^{th}$ adder in the L adders is configured to: receive a $(2L-1)^{th}$ second baseband signal sent by a $(2L-1)^{th}$ DPD processor in the N DPD processors and a $2L^{th}$ second baseband signal sent by a $2L^{th}$ DPD processor in the N DPD processors, add the $(2L-1)^{th}$ second baseband signal and the $2L^{th}$ second baseband signal to obtain a $(2L+1)^{th}$ DPD processor input signal in the N DPD processor input signals, and send the $(2L+1)^{th}$ DPD processor input signal to a $(2L+1)^{th}$ DPD processor in the N DPD processors. The $(2L-1)^{th}$ second baseband signal is a $(2L-1)^{th}$ second baseband signal in the N second baseband signals, the $2L^{th}$ second baseband signal is a $2L^{th}$ second baseband signal in the N second baseband signals, and when x is 1 or 2, the first baseband signal is the $x^{th}$ DPD processor input signal. In the fourth design of the first aspect, the DPD processors perform pre-distortion processing on signals, and the adders perform feedback complex adding on signals to obtain N signals on which pre-distortion processing has been performed. During signal amplification, this implementation intends to more effectively reduce non-linear distortion and improve amplification efficiency in a scenario in which there is significant non-linear distortion.

According to the first aspect or any design of the first aspect, in a fifth design, the second pre-distortion part includes W signal determining parts. An $e^{th}$ signal determining part in the W signal determining parts is configured to: receive the N second baseband signals and the network coefficient, and determine an $e^{th}$ second pre-distortion part output signal based on the N second baseband signals and the network coefficient, where the $e^{th}$ second pre-distortion part output signal corresponds to at least one of the M third baseband signals, where e is an integer, and a value of e ranges from 1 to W. Specifically, the $e^{th}$ signal determining part performs linear transformation on the N second baseband signals based on the network coefficient to obtain the $e^{th}$ second pre-distortion part output signal. In the fifth design of the first aspect, M signals on which pre-distortion processing has been performed may be obtained through linear transformation, and the M signals on which pre-distortion processing has been performed are pre-distortion signals opposite to amplification performance of M PAs of the multi-antenna sending apparatus, so that for a signal needing to be sent, a signal that is not amplified is in a linear relationship with an amplified signal, to improve amplification efficiency of the PAs of the multi-antenna sending apparatus. Compared with the pre-distortion processing apparatus in the conventional multi-antenna sending apparatus, according to the pre-distortion processing apparatus provided in the embodiment of this application, M-N DPD processors are reduced, to optimize a structure of the pre-distortion processing apparatus, and reduce design complexity, costs, and power consumption. In addition, a difference between non-linear characteristics of different PAs is considered, so that it can be ensured that functions of signal amplification on the transmit channels in the multi-antenna sending apparatus are linear.

According to the first aspect or any design of the first aspect, in a sixth design, the feedback signal conversion part includes a coupling part, a frequency mixing part, and an analog to digital converter ADC. The coupling part is configured to: receive the R radio frequency signals amplified by the power amplifiers, obtain one coupling part output signal based on the R radio frequency signals amplified by the power amplifiers, and send the coupling part output signal to the frequency mixing part. The frequency mixing part is configured to: receive a carrier signal and the coupling part output signal, perform down-conversion on the coupling part output signal based on the carrier signal to obtain a sixth baseband signal, and send the sixth baseband signal to the ADC. The ADC is configured to: perform analog to digital conversion on the sixth baseband signal to obtain the fifth baseband signal, and send the fifth baseband signal to the solving part. According to the sixth design of the first aspect, the radio frequency signals amplified by the power amplifiers may be fed back to the solving part of the pre-distortion processing apparatus, so that the solving part can obtain the network coefficient and the N sets of pre-distortion parameters, and can support the first pre-distortion part and the second pre-distortion part in performing pre-distortion processing.

According to any one of the first aspect, or the first to fifth designs of the first aspect, in a seventh design, the feedback signal conversion part includes a coupling part, a frequency mixing part, a clipper, and an ADC. The coupling part is configured to: receive the R radio frequency signals amplified by the power amplifiers, obtain one coupling part output signal based on the R radio frequency signals amplified by the power amplifiers, and send the coupling part output signal to the frequency mixing part. The frequency mixing part is configured to: receive a carrier signal and the coupling part output signal, perform down-conversion on the coupling part output signal based on the carrier signal to obtain a sixth baseband signal, and send the sixth baseband signal to the clipper. The clipper is configured to: perform amplitude limiting processing on the sixth baseband signal to obtain a seventh baseband signal, and send the seventh baseband signal to the ADC. The ADC is configured to: perform analog to digital conversion on the seventh baseband signal to obtain the fifth baseband signal, and send the fifth baseband signal to the solving part. Compared with the sixth design of the first aspect, in the seventh design of the first aspect, the clipper is added. When an amplitude of a signal is relatively high, the added clipper may perform amplitude limiting processing on the signal, to reduce interference caused by a wave peak of the signal to a wave trough of the signal, and further reduce a damage caused by an excessively high signal amplitude or excessively high interference to the ADC.

According to a second aspect, this application provides an apparatus, including any one of the first aspect, or the first to the fifth designs of the first aspect, and at least one DAC. The second pre-distortion part is further configured to send a $t^{th}$ third baseband signal in the M third baseband signals to one DAC in the at least one DAC. The DAC in the at least one DAC is configured to perform digital to analog conversion on the $t^{th}$ third baseband signal to obtain a $t^{th}$ fourth baseband signal in M fourth baseband signals.

According to a third aspect, this application provides an apparatus, including the second aspect, an oscillator, and M frequency mixing parts. The DAC in the at least one DAC is further configured to send the $t^{th}$ fourth baseband signal in the M fourth baseband signals to a $t^{th}$ frequency mixing part in the M frequency mixing parts. The oscillator is configured to: generate a carrier signal, and send the carrier signal to the M frequency mixing parts. A $t^{th}$ frequency mixing part in the M frequency mixing parts is configured to perform up-conversion on the $t^{th}$ fourth baseband signal based on the carrier signal to obtain a $t^{th}$ first radio frequency signal in M first radio frequency signals, where t is an integer, and a value of t ranges from 1 to M.

According to a fourth aspect, this application provides an apparatus, including the sixth design or the seventh design of the first aspect and at least one DAC. The second pre-distortion part is the same as the second pre-distortion part in the second aspect, and the at least one DAC is the same as the at least one DAC in the second aspect.

According to a fifth aspect, this application provides an apparatus, including the fourth aspect, an oscillator, and M frequency mixing parts. The DAC in the at least one DAC is further configured to send the $t^{th}$ fourth baseband signal in the M fourth baseband signals to a $t^{th}$ frequency mixing part in the M frequency mixing parts. The oscillator is configured to: generate a carrier signal, and send the carrier signal to the M frequency mixing parts and the frequency mixing part that is included in the feedback signal conversion part. The $t^{th}$ frequency mixing part in the M frequency mixing parts is configured to perform up-conversion on the $t^{th}$ fourth baseband signal based on the carrier signal to obtain a $t^{th}$ first radio frequency signal in M first radio frequency signals, where t is an integer, and a value oft ranges from 1 to M.

According to a sixth aspect, this application provides a pre-distortion processing apparatus, including: a first pre-distortion part, at least one DAC, a second pre-distortion part, a feedback signal conversion part, and a solving part. The first pre-distortion part includes N DPD processors, and is configured to: receive a first baseband signal and N sets of pre-distortion parameters, perform digital pre-distortion processing on the first baseband signal based on the N sets of pre-distortion parameters to obtain N second baseband signals, and send the N second baseband signals to the at least one DAC. The at least one DAC is configured to: perform digital to analog conversion on the N second baseband signals to obtain N third baseband signals, and send the N third baseband signals to the second pre-distortion part. The second pre-distortion part is configured to: receive the N third baseband signals and a network coefficient, and determine M fourth baseband signals based on the N third baseband signals and the network coefficient. The feedback signal conversion part is configured to: receive R radio frequency signals amplified by power amplifiers, where the R radio frequency signals amplified by the power amplifiers are radio frequency signals obtained based on the M fourth baseband signals; convert, into a fifth baseband signal, the R radio frequency signals amplified by the power amplifiers; and send the fifth baseband signal to the solving part, where R is an integer greater than or equal to 1 and less than or equal to M. The solving part is configured to: receive the first baseband signal and the fifth baseband signal, determine the N sets of pre-distortion parameters and the network coefficient based on the first baseband signal and the fifth baseband signal, send the N sets of pre-distortion parameters to the first pre-distortion part, and send the network coefficient to the second pre-distortion part, where N and M are integers, N is greater than 1, and M is greater than or equal to N. Optionally, the first baseband signal may be a service signal, or may be a signal specially used for digital pre-distortion processing. According to the apparatus in the sixth aspect, the first pre-distortion part and the second pre-distortion part implement a pre-distortion processing function, to improve amplification efficiency of PAs of a multi-antenna sending apparatus. The pre-distortion processing apparatus can not only reduce design complexity, costs, and power consumption, but also ensure that functions of signal amplification on transmit channels in the multi-antenna sending apparatus are linear.

According to the sixth aspect, in a first design, the first pre-distortion part specifically includes the N DPD processors. An $x^{th}$ DPD processor in the N DPD processors is configured to: receive an $x^{th}$ set of pre-distortion parameters in the N sets of pre-distortion parameters and an $x^{th}$ DPD processor input signal, perform digital pre-distortion processing on the $x^{th}$ DPD processor input signal based on the $x^{th}$ set of pre-distortion parameters to obtain an $x^{th}$ second baseband signal in the N second baseband signals, and send the $x^{th}$ second baseband signal to one DAC in the at least one DAC, where x is an integer, and a value of x ranges from 1 to N. When x is 1, the $x^{th}$ DPD processor input signal is the first baseband signal; or when x is any one of 2 to N, the $x^{th}$ DPD processor input signal is an $(x-1)^{th}$ second baseband signal sent by an $(x-1)^{th}$ DPD processor in the N DPD processors, and the $(x-1)^{th}$ second baseband signal is an $(x-1)^{th}$ second baseband signal in the N second baseband signals. In the first design of the sixth aspect, the DPD processors are cascaded to perform pre-distortion processing on signals to obtain N signals on which pre-distortion processing has been performed. This implementation has a relatively simple design, relatively low costs, and relatively low power consumption.

According to the sixth aspect, in a second design, the first pre-distortion part specifically includes the N DPD processors and N−1 multipliers. An $x^{th}$ DPD processor in the N DPD processors is configured to: receive an $x^{th}$ set of pre-distortion parameters in the N sets of pre-distortion parameters and an $x^{th}$ DPD processor input signal in N DPD processor input signals, and perform digital pre-distortion processing on the $x^{th}$ DPD processor input signal based on the $x^{th}$ set of pre-distortion parameters to obtain an $x^{th}$ DPD processor output signal in N DPD processor output signals, where x is an integer, and a value of x ranges from 1 to N. When x is 1, the $x^{th}$ DPD processor input signal is the first baseband signal; or when x is any one of 2 to N, the $x^{th}$ DPD processor input signal is an $(x-1)^{th}$ DPD processor output signal sent by an $(x-1)^{th}$ DPD processor in the N DPD processors, and the $(x-1)^{th}$ DPD processor output signal is an $(x-1)^{th}$ DPD processor output signal in the N DPD processor output signals. A $y^{th}$ multiplier in the N−1 multipliers is configured to: receive a $y^{th}$ DPD processor output signal sent by a $y^{th}$ DPD processor in the N DPD processors and a $(y+1)^{th}$ DPD processor output signal sent by a $(y+1)^{th}$ DPD processor in the N DPD processors, multiply the $y^{th}$ DPD processor output signal by the $(y+1)^{th}$ DPD processor output signal to obtain a $y^{th}$ second baseband signal in the N second baseband signals, and send the $y^{th}$ second baseband signal to one DAC in the at least one DAC, where the $y^{th}$ DPD processor output signal is a $y^{th}$ DPD processor output signal in the N DPD processor output signals, the $(y+1)^{th}$ DPD processor output signal is a $(y+1)^{th}$ DPD processor output signal in the N DPD processor output signals, y is an integer, and a value of y ranges from 1 to N−1. When x is N, the $x^{th}$ DPD processor output signal is an $x^{th}$ second baseband signal in the N second baseband signals, and the $x^{th}$ DPD processor is further configured to send the $x^{th}$ second baseband signal to one DAC in the at least one DAC. In the second design of the sixth aspect, the DPD processors perform pre-distortion processing on signals, and the multipliers perform feedback complex multiplication on signals to obtain N signals on which pre-distortion processing has been performed. During signal amplification, this implementation intends to more effectively reduce non-linear distortion and improve amplification efficiency in a scenario in which there is significant non-linear distortion.

According to the sixth aspect, in a third design, the first pre-distortion part specifically includes the N DPD processors and N−1 adders. An $x^{th}$ DPD processor in the N DPD processors is configured to: receive an $x^{th}$ set of pre-distortion parameters in the N sets of pre-distortion parameters and the first baseband signal, and perform digital pre-distortion processing on the first baseband signal based on the $x^{th}$ set of pre-distortion parameters to obtain an $x^{th}$ DPD processor output signal in N DPD processor output signals, where x is an integer, and a value of x ranges from 1 to N. A $y^{th}$ adder in the N−1 adders is configured to: receive a $y^{th}$ DPD processor output signal sent by a $y^{th}$ DPD processor in the N DPD processors and a $(y+1)^{th}$ DPD processor output signal sent by a $(y+1)^{th}$ DPD processor in the N DPD processors, add the $y^{th}$ DPD processor output signal and the $(y+1)^{th}$ DPD processor output signal to obtain a $y^{th}$ second baseband signal in the N second baseband signals, and send the $y^{th}$ second baseband signal to one DAC in the at least one DAC, where the $y^{th}$ DPD processor output signal is a $y^{th}$ DPD processor output signal in the N DPD processor output signals, the $(y+1)^{th}$ DPD processor output signal is a $(y+1)^{th}$ DPD processor output signal in the N DPD processor output signals, y is an integer, and a value of y ranges from 1 to N−1. When x is N, the $x^{th}$ DPD processor output signal is an $x^{th}$ second baseband signal in the N second baseband signals, and the $x^{th}$ DPD processor is further configured to send the $x^{th}$ second baseband signal to one DAC in the at least one DAC. In the third design of the sixth aspect, the DPD processors perform pre-distortion processing on signals, and the adders perform feedback complex adding on signals to obtain N signals on which pre-distortion processing has been performed. During signal amplification, this implementation intends to more effectively reduce non-linear distortion and improve amplification efficiency in a scenario in which there is significant non-linear distortion.

According to the sixth aspect, in a fourth design, the first pre-distortion part specifically includes the N DPD processors and L adders, where L is a value obtained by rounding ((N−2)/2) up to the next integer. An $x^{th}$ DPD processor in the N DPD processors is configured to: receive an $x^{th}$ set of pre-distortion parameters in the N sets of pre-distortion parameters and an $x^{th}$ DPD processor input signal in N DPD processor input signals, perform digital pre-distortion processing on the $x^{th}$ DPD processor input signal based on the $x^{th}$ set of pre-distortion parameters to obtain an $x^{th}$ second baseband signal in the N second baseband signals, and send the $x^{th}$ second baseband signal to one DAC in the at least one DAC, where x is an integer, and a value of x ranges from 1 to N. A $p^{th}$ adder in the L adders is configured to: receive a $(2p-1)^{th}$ second baseband signal sent by a $(2p-1)^{th}$ DPD processor in the N DPD processors and a $2p^{th}$ second baseband signal sent by a $2p^{th}$ DPD processor in the N DPD processors, add the $(2p-1)^{th}$ second baseband signal and the $2p^{th}$ second baseband signal to obtain a $(2p+1)^{th}$ DPD processor input signal and a $(2p+2)^{th}$ DPD processor input signal in the N DPD processor input signals, and send the $(2p+1)^{th}$ DPD processor input signal and the $(2p+2)^{th}$ DPD processor input signal to a $(2p+1)^{th}$ DPD processor and a $(2p+2)^{th}$ DPD processor in the N DPD processors, where the $(2p-1)^{th}$ second baseband signal is a $(2p-1)^{th}$ second baseband signal in the N second baseband signals, the $2p^{th}$ second baseband signal is a $2p^{th}$ second baseband signal in the N second baseband signals, p is an integer, and a value of p ranges from 1 to L−1. L is a multiple of 2, and an $L^{th}$ adder in the L adders is configured to: receive a $(2L-1)^{th}$ second baseband signal sent by a $(2L-1)^{th}$ DPD processor in the N DPD processors and a $2L^{th}$ second baseband signal sent by a $2L^{th}$ DPD processor in the N DPD processors, add the $(2L-1)^{th}$ second baseband signal and the $2L^{th}$ second baseband signal to obtain a $(2L+1)^{th}$ DPD processor input signal and a $(2L+2)^{th}$ DPD processor input signal in the N DPD processor input signals, and send the $(2L+1)^{th}$ DPD processor input signal and the $(2L+2)^{th}$ DPD processor input signal to a $(2L+1)^{th}$ DPD processor and a $(2L+2)^{th}$ DPD processor in the N DPD processors; or L is not a multiple of 2, and an $L^{th}$ adder in the L adders is configured to: receive a $(2L-1)^{th}$ second baseband signal sent by a $(2L-1)^{th}$ DPD processor in the N DPD processors and a $2L^{th}$ second baseband signal sent by a $2L^{th}$ DPD processor in the N DPD processors, add the $(2L-1)^{th}$ second baseband signal and the $2L^{th}$ second baseband signal to obtain a $(2L+1)^{th}$ DPD processor input signal in the N DPD processor input signals, and send the $(2L+1)^{th}$ DPD processor input signal to a $(2L+1)^{th}$ DPD processor in the N DPD processors. The $(2L-1)^{th}$ second baseband signal is a $(2L-1)^{th}$ second baseband signal in the N second baseband signals, the $2L^{th}$ second baseband signal is a $2L^{th}$ second baseband signal in the N second baseband signals, and when x is 1 or 2, the first baseband signal is the $x^{th}$ DPD processor input signal. In the fourth design of the sixth aspect, the DPD processors perform pre-distortion processing on signals, and the adders perform feedback complex adding on signals to obtain N signals on which pre-distortion processing has been performed. During signal amplification, this implementation intends to more effectively reduce non-linear distortion and improve amplification efficiency in a scenario in which there is significant non-linear distortion.

According to the sixth aspect or any design of the sixth aspect, in a fifth design, the second pre-distortion part includes W signal determining parts. An $e^{th}$ signal determining part in the W signal determining parts is configured to: receive the N third baseband signals and the network coefficient, and determine an $e^{th}$ second pre-distortion part output signal based on the N third baseband signals and the network coefficient, where the $e^{th}$ second pre-distortion part output signal corresponds to at least one of the M fourth baseband signals, where t is an integer, and a value of t ranges from 1 to M. Specifically, the in $e^{th}$ signal determining part performs linear transformation on the N third baseband signals based on the network coefficient to obtain the $e^{th}$ second pre-distortion part output signal. A technical effect of the fifth design of the sixth aspect is the same as that of the fifth design of the first aspect.

According to the sixth aspect or any design of the sixth aspect, in a sixth design, the feedback signal conversion part is the same as that in the sixth design of the first aspect.

According to any one of the sixth aspect, or the first to the fifth designs of the sixth aspect, in a seventh design, the feedback signal conversion part is the same as that in the seventh design of the first aspect.

According to a seventh aspect, this application provides an apparatus, including any one of the sixth aspect, or the first to the fifth designs of the sixth aspect, an oscillator, and M frequency mixing parts. The second pre-distortion part is further configured to send a $t^{th}$ fourth baseband signal in the M fourth baseband signals to a $t^{th}$ frequency mixing part in the M frequency mixing parts. The oscillator is configured to: generate a carrier signal, and send the carrier signal to the M frequency mixing parts. The $t^{th}$ frequency mixing part in the M frequency mixing parts is configured to perform up-conversion on the $t^{th}$ fourth baseband signal based on the carrier signal to obtain a $t^{th}$ first radio frequency signal in M first radio frequency signals, where t is an integer, and a value oft ranges from 1 to M.

According to an eighth aspect, this application provides an apparatus, including the sixth design or the seventh design of the sixth aspect, an oscillator, and M frequency mixing parts. The second pre-distortion part is further configured to send a $t^{th}$ fourth baseband signal in the M fourth baseband signals to a $t^{th}$ frequency mixing part in the M frequency mixing parts. The oscillator is configured to: generate a carrier signal, and send the carrier signal to the M frequency mixing parts and the frequency mixing part that is included in the feedback signal conversion part. The $t^{th}$ frequency mixing part in the M frequency mixing parts is configured to perform up-conversion on the $t^{th}$ fourth baseband signal based on the carrier signal to obtain a $t^{th}$ first radio frequency signal in M first radio frequency signals, where t is an integer, and a value oft ranges from 1 to M.

According to a ninth aspect, this application provides an apparatus, including any one of the third aspect, the fifth aspect, the seventh aspect, or the eighth aspect and M power amplifiers PAs. The $t^{th}$ frequency mixing part in the M frequency mixing parts is further configured to send the $t^{th}$ first radio frequency signal in the M first radio frequency signals to a $t^{th}$ PA in the M PAs. The $t^{th}$ PA in the M PAs is configured to: amplify the $t^{th}$ first radio frequency signal to obtain a $t^{th}$ second radio frequency signal in M second radio frequency signals, send the $t^{th}$ second radio frequency signal to the feedback signal conversion part, and the $t^{th}$ second radio frequency signal is used as one radio frequency signal amplified by a power amplifier in the R radio frequency signals that are amplified by the power amplifiers and that are received by the feedback signal conversion part, where t is an integer, and a value of t ranges from 1 to M.

According to a tenth aspect, this application provides a device, including the ninth aspect and M antennas. The $t^{th}$ PA in the M PAs is further configured to send the $t^{th}$ second radio frequency signal to a $t^{th}$ antenna in the M antennas. The $t^{th}$ antenna in the M antennas is configured to send the $t^{th}$ second radio frequency signal, where t is an integer, and a value of t ranges from 1 to M.

According to an eleventh aspect, this application provides a chip system. The chip system may be any apparatus described above. The chip system may include a chip, or may include a chip and another discrete device. The chip may be an application-specific integrated circuit (ASIC), or may be a chip in another form. Optionally, the chip system may further include a processor, configured to support a pre-distortion processing apparatus in implementing functions in the foregoing aspects. In a possible design, the chip system further includes a memory, and the memory is configured to store a program instruction and data that are necessary to the pre-distortion processing apparatus.

According to a twelfth aspect, this application provides a digital pre-distortion processing method, including: performing digital pre-distortion processing on a first baseband signal based on N sets of pre-distortion parameters to obtain N second baseband signals; determining M third baseband signals based on the N second baseband signals and a network coefficient; obtaining a fifth baseband signal based on R radio frequency signals amplified by power amplifiers, where the R radio frequency signals amplified by the power amplifiers are determined based on the M third baseband signals; and determining the N sets of pre-distortion parameters and the network coefficient based on the first baseband signal and the fifth baseband signal, where N, M, and R are integers, N is greater than 1, and M is greater than or equal to N.

According to the twelfth aspect, in a first design, the performing digital pre-distortion processing on a first baseband signal based on N sets of pre-distortion parameters to obtain N second baseband signals includes: x is an integer, and a value of x ranges from 1 to N; when x is 1, performing digital pre-distortion processing on the first baseband signal based on an $x^{th}$ set of pre-distortion parameters in the N sets of pre-distortion parameters to obtain an $x^{th}$ second baseband signal in the N second baseband signals; or when x is any integer from 2 to N, performing digital pre-distortion processing on an $(x-1)^{th}$ second baseband signal in the N second baseband signals based on an $x^{th}$ set of pre-distortion parameters in the N sets of pre-distortion parameters to obtain an $x^{th}$ second baseband signal in the N second baseband signals.

According to the twelfth aspect, in a second design, the performing digital pre-distortion processing on a first baseband signal based on N sets of pre-distortion parameters to obtain N second baseband signals includes: x is an integer, and a value of x ranges from 1 to N; when x is any integer from 1 to N, performing digital pre-distortion processing on an $x^{th}$ input signal in N input signals based on an $x^{th}$ set of pre-distortion parameters in the N sets of pre-distortion parameters to obtain an $x^{th}$ output signal in N output signals, where when x is 1, the $x^{th}$ input signal is the first baseband signal, or when x is any integer from 2 to N, the $x^{th}$ input signal is an $(x-1)^{th}$ output signal in the N output signals; and when x is any integer from 1 to N−1, multiplying the $x^{th}$ output signal by an $(x+1)^{th}$ output signal in the N output signals to obtain an $x^{th}$ second baseband signal in the N second baseband signals; or when x is N, determining that the $x^{th}$ output signal in the N output signals is an $x^{th}$ second baseband signal in the N second baseband signals.

According to the twelfth aspect, in a third design, the performing digital pre-distortion processing on a first baseband signal based on N sets of pre-distortion parameters to obtain N second baseband signals includes: x is an integer, and a value of x ranges from 1 to N; when x is any integer from 1 to N, performing digital pre-distortion processing on an $x^{th}$ input signal in N input signals based on an $x^{th}$ set of pre-distortion parameters in the N sets of pre-distortion parameters to obtain an $x^{th}$ output signal in N output signals, where the $x^{th}$ input signal is the first baseband signal; and when x is any integer from 1 to N−1, adding the $x^{th}$ output signal and an $(x+1)^{th}$ output signal in the N output signals to obtain an $x^{th}$ second baseband signal in the N second baseband signals; or when x is N, determining that the $x^{th}$ output signal in the N output signals is an $x^{th}$ second baseband signal in the N second baseband signals.

According to the twelfth aspect, in a fourth design, the performing digital pre-distortion processing on a first baseband signal based on N sets of pre-distortion parameters to obtain N second baseband signals includes: x is an integer, and a value of x ranges from 1 to N; when x is any integer from 1 to N, performing digital pre-distortion processing on an $x^{th}$ input signal in N input signals based on an $x^{th}$ set of pre-distortion parameters in the N sets of pre-distortion parameters to obtain an $x^{th}$ second baseband signal in the N second baseband signals, where when x is 1 or 2, the $x^{th}$ input signal is the first baseband signal; or when x is any integer from 2 to N, the $x^{th}$ input signal is a signal obtained by adding a $(2p-1)^{th}$ output signal and a $2p^{th}$ output signal in the N output signals, where p is equal to a value obtained by rounding $((x-2)/2)$ up to the next integer.

According to the twelfth aspect or any design of the twelfth aspect, in a fifth design, the determining M third baseband signals based on the N second baseband signals and a network coefficient includes: determining a $t^{th}$ third baseband signal in the M third baseband signals based on the N second baseband signals and the network coefficient, where t is an integer, and a value of t ranges from 1 to M.

According to the twelfth aspect or any design of the twelfth aspect, in a sixth aspect, the method further includes: performing analog to digital conversion on the $t^{th}$ third baseband signal in the M third baseband signals to obtain a $t^{th}$ fourth baseband signal in M fourth baseband signals; performing up-conversion on the $t^{th}$ fourth baseband signal based on a carrier signal to obtain a $t^{th}$ first radio frequency signal in M first radio frequency signals; and performing power amplification on the $t^{th}$ first radio frequency signal to obtain a $t^{th}$ radio frequency signal in the M radio frequency signals amplified by the power amplifiers, where t is an integer, and a value of t ranges from 1 to M.

According to the twelfth aspect or any design of the twelfth aspect, in a seventh design, the obtaining a fifth baseband signal based on R radio frequency signals amplified by power amplifiers includes: obtaining one output signal based on the R radio frequency signals amplified by the power amplifiers; performing down-conversion on the output signal based on the carrier signal to obtain a sixth baseband signal; and performing analog to digital conversion on the sixth baseband signal to obtain the fifth baseband signal.

According to any one of the twelfth aspect, or the first to the sixth designs of the twelfth aspect, in an eighth design, the obtaining a fifth baseband signal based on R radio frequency signals amplified by power amplifiers includes: obtaining one output signal based on the R radio frequency signals amplified by the power amplifiers; performing down-conversion on the output signal based on the carrier signal to obtain a sixth baseband signal; performing amplitude limiting processing on the sixth baseband signal to obtain a seventh baseband signal; and performing analog to digital conversion on the seventh baseband signal to obtain the fifth baseband signal.

According to a thirteenth aspect, this application provides a digital pre-distortion processing method, including: performing digital pre-distortion processing on a first baseband signal based on N sets of pre-distortion parameters to obtain N second baseband signals; performing digital to analog conversion on the N second baseband signals to obtain N third baseband signals; determining M fourth baseband signals based on the N third baseband signals and a network coefficient; obtaining a fifth baseband signal based on R radio frequency signals amplified by power amplifiers, where the R radio frequency signals amplified by the power amplifiers are determined based on the M fourth baseband signals; and determining the N sets of pre-distortion parameters based on the network coefficient on the first baseband signal and the fifth baseband signal, where N, M, and R are integers, N is greater than 1, M is greater than or equal to N, and R is greater than or equal to 1 and less than or equal to M.

According to the thirteenth aspect, in a first design, a method for performing digital pre-distortion processing on the first baseband signal based on the N sets of pre-distortion parameters to obtain the N second baseband signals is the same as that in any one of the first design to the fourth design of the twelfth aspect.

According to the thirteenth aspect or the first design of the thirteenth aspect, in a second design, the determining M fourth baseband signals based on the N third baseband signals and a network coefficient includes: determining a $t^{th}$ fourth baseband signal in the M fourth baseband signals based on the N third baseband signals and the network coefficient, where t is an integer, and a value of t ranges from 1 to M.

According to the thirteenth aspect or the first or second design of the thirteenth aspect, in a third design, the method further includes: performing up-conversion on the $t^{th}$ fourth baseband signal in the M fourth baseband signals based on a carrier signal to obtain a $t^{th}$ first radio frequency signal in M first radio frequency signals; and performing power amplification on the $t^{th}$ first radio frequency signal in the M first radio frequency signals to obtain a $t^{th}$ radio frequency signal in the M radio frequency signals amplified by the power amplifiers.

According to any one of the thirteenth aspect, or the first to the third designs of the thirteenth aspect, in a fourth design, a method for determining the fifth baseband signal based on the R radio frequency signals amplified by the power amplifiers is the same as that in the seventh or the eighth design of the twelfth aspect.

According to a fourteenth aspect, an embodiment of this application provides a pre-distortion processing apparatus. The pre-distortion processing apparatus has functions of implementing the methods in the twelfth aspect, the designs of the twelfth aspect, the thirteenth aspect, and the designs of the thirteenth aspect. The functions may be implemented by hardware, or by hardware executing corresponding software. The hardware or software includes one or more modules corresponding to the functions.

According to a fifteenth aspect, an embodiment of this application provides a computer storage medium, configured to store a computer software instruction used by the foregoing pre-distortion processing apparatus, where the computer software instruction includes a program designed for executing the foregoing aspects.

BRIEF DESCRIPTION OF DRAWINGS

To describe the technical solutions in the embodiments of this application or in the background more clearly, the following briefly describes the accompanying drawings required for describing the embodiments of this application or the background.

DETAILED DESCRIPTION OF EMBODIMENTS

Figure 1:
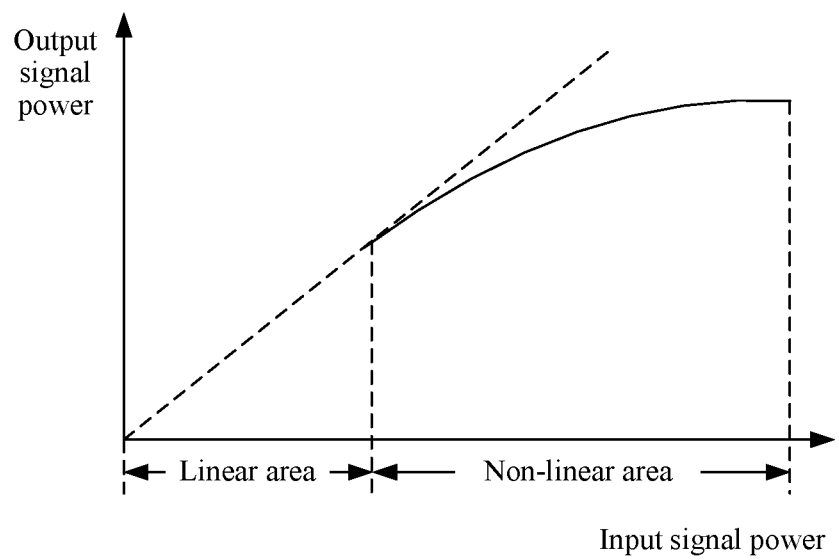
FIG. 1 is a schematic diagram of an amplification function of a power amplifier.

The following describes the embodiments of this application with reference to the accompanying drawings.

Network architectures and service scenarios described in the embodiments of this application are used to more clearly describe the technical solutions in the embodiments of this application, but are not intended to limit the technical solutions provided in the embodiments of this application. As the network architectures evolve and new service scenarios emerge, the technical solutions provided in the embodiments of this application are applicable to similar technical problems.

The technical solutions provided in the embodiments of this application may be applied to various communications systems, for example, a global system for mobile communications (GSM), a code division multiple access (CDMA) system, a wideband code division multiple access (WCDMA) system, a time division-synchronous code division multiple access (TD-SCDMA) system, a universal mobile telecommunications system (UMTS), a long term evolution (LTE) system, and a fifth generation mobile communications technology (5G) system. With the constant development of communications technologies, the technical solutions provided in the embodiments of this application may be further applied to future networks. Further, the technical solutions provided in the embodiments of this application may be applied to another communications system needing to implement pre-distortion processing. In the embodiments of this application, ranges of terms "system" and "network" are similar. In a communications system, a device using the technical solutions provided in the embodiments of this application is a transmit device, and the transmit device may be a network device, or may be user equipment. The transmit device may alternatively be referred to as a sending device.

User equipment (UE) in the embodiments of this application includes a handheld device, vehicle-mounted device, wearable device, or computing device that has a wireless communication function, or another processing device connected to a wireless modem. The user equipment may alternatively be referred to as a terminal, a mobile station (MS), a mobile terminal (MT), a user terminal (UT), a user agent (UA), terminal equipment (TE), or the like, and this is not limited in this application.

A network device in the embodiments of this application includes a base station (BS), a network controller, a mobile switching center, or another access network device. The base station includes a macro base station, a micro base station, a relay station, an access point, and the like in various forms. For example, the base station may be a base station in GSM or CDMA: a base transceiver station (BTS); or may be a base station in WCDMA: a NodeB; or may be an evolved base station in LTE: eNB or e-NodeB (NodeB); or may be a base station in a 5G system, where the base station in the 5G system may be referred to as a transmission reception point TRP (TRP), a gNB (generation NodeB), or another name. Alternatively, the base station may be a base station in a future network, and this is not limited in this application.

The embodiments of this application provide several pre-distortion processing methods and corresponding pre-distortion processing apparatuses. The methods or apparatuses may be applied to a transmit device, and may be further applied to a sending apparatus of the transmit device, to reduce distortion of amplification of a PA in a non-linear area.

Figure 2:
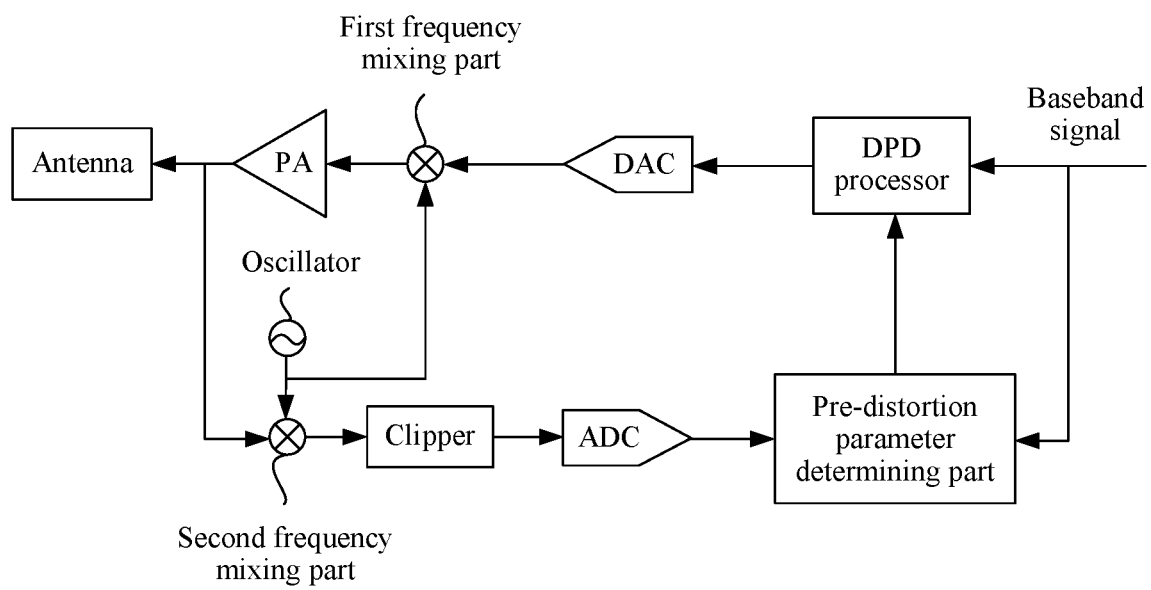
FIG. 2 is a schematic structural diagram of a pre-distortion processing apparatus according to an embodiment of this application.

In the sending apparatus of the transmit device, to overcome distortion of the amplification function of the power amplifier (PA) in the non-linear area, the sending apparatus includes a pre-distortion processing apparatus. The pre-distortion processing apparatus includes a digital pre-distortion (DPD) processor, configured to generate a pre-distortion signal opposite to amplification performance of the PA, so that for a signal needing to be sent, a signal that is not amplified is in a linear relationship with an amplified signal. For example, FIG. 2 is a schematic structural diagram of a pre-distortion processing apparatus. As shown in FIG. 2, the pre-distortion processing apparatus includes a DPD processor, a digital to analog converter (DAC), a first frequency mixing part, an oscillator, a second frequency mixing part, a clipper, an analog to digital converter (ADC), and a pre-distortion parameter determining part. To show a signal flow direction and a process of processing a signal by the pre-distortion processing apparatus, FIG. 2 further shows a PA and an antenna. For the pre-distortion processing apparatus shown in FIG. 2, a signal processing process is: The DPD processor receives a first baseband signal and a pre-distortion parameter that is sent by the pre-distortion parameter determining part, performs pre-distortion processing on the first baseband signal based on the pre-distortion parameter and a pre-distortion processing algorithm to obtain a second baseband signal, and sends the second baseband signal to the DAC; the DAC performs digital to analog conversion on the second baseband signal to obtain a third baseband signal, and sends the third baseband signal to the first frequency mixing part; the oscillator generates a carrier signal, and sends the carrier signal to the first frequency mixing part and the second frequency mixing part; the first frequency mixing part performs up-conversion on the third baseband signal based on the carrier signal to obtain a first radio frequency signal, and sends the first radio frequency signal to the PA; the PA amplifies the first radio frequency signal to obtain a second radio frequency signal, sends the second radio frequency signal to the antenna, and feeds back the second radio frequency signal to the second frequency mixing part; the antenna sends the second radio frequency signal; the second frequency mixing part performs down-conversion on the second radio frequency signal based on the carrier signal to obtain a fourth baseband signal, and sends the fourth baseband signal to the clipper; the clipper performs amplitude limiting processing on the fourth baseband signal to obtain a fifth baseband signal, and sends the fifth baseband signal to the ADC; the ADC performs analog to digital conversion on the fifth baseband signal to obtain a sixth baseband signal, and sends the sixth baseband signal to the pre-distortion parameter determining part; and the pre-distortion parameter determining part receives the sixth baseband signal and the first baseband signal, determines the pre-distortion parameter based on the sixth baseband signal, the first baseband signal, and a pre-distortion parameter solving algorithm, and sends the pre-distortion parameter to the DPD processor. According to the pre-distortion processing apparatus shown in FIG. 2, a linear amplification relationship between the first baseband signal and the second radio frequency signal can be maintained, to improve amplification efficiency of the PA. "First", "second", "third", "fourth", "fifth", "sixth", "seventh", and the like in embodiments of this application are merely used for differentiation, and do not represent a sequence or sizes.

In embodiments of this application, the DPD processor is configured to implement a digital pre-distortion processing function, and may be implemented in a form of hardware, software, or software plus hardware. When the DPD processor is implemented in the form of hardware or software plus hardware, the DPD processor may be an independent device, or may be a component of a chip system. In an example, the chip system is the pre-distortion processing apparatus provided in embodiments of this application.

In embodiments of this application, a frequency mixing part includes one or more frequency mixers, and is configured to perform up-conversion on a baseband signal to obtain a radio frequency signal, or perform down-conversion on a radio frequency signal to obtain a baseband signal. In other words, an up-conversion function or a down-conversion function described in embodiments of this application may be implemented by using one frequency mixer or a plurality of frequency mixers, and this is not limited in this application. For example, the frequency mixing part includes two frequency mixers, and a function of performing, by the frequency mixing part, up-conversion on one baseband signal to obtain one radio frequency signal may be implemented by using the two frequency mixers. Specifically, this implementation is: A first frequency mixer in the two frequency mixers performs up-conversion on the baseband signal to obtain one intermediate frequency signal, and a second frequency mixer in the two frequency mixers performs up-conversion on the intermediate frequency signal to obtain the radio frequency signal. For example, the frequency mixing part includes two frequency mixers, and a function of performing, by the frequency mixing part, down-conversion on one radio frequency signal to obtain one baseband signal may be implemented by using the two frequency mixers. Specifically, this implementation is: A first frequency mixer in the two frequency mixers performs down-conversion on the radio frequency signal to obtain one intermediate frequency signal, and a second frequency mixer in the two frequency mixers performs down-conversion on the intermediate frequency signal to obtain the baseband signal.

Figure 3:
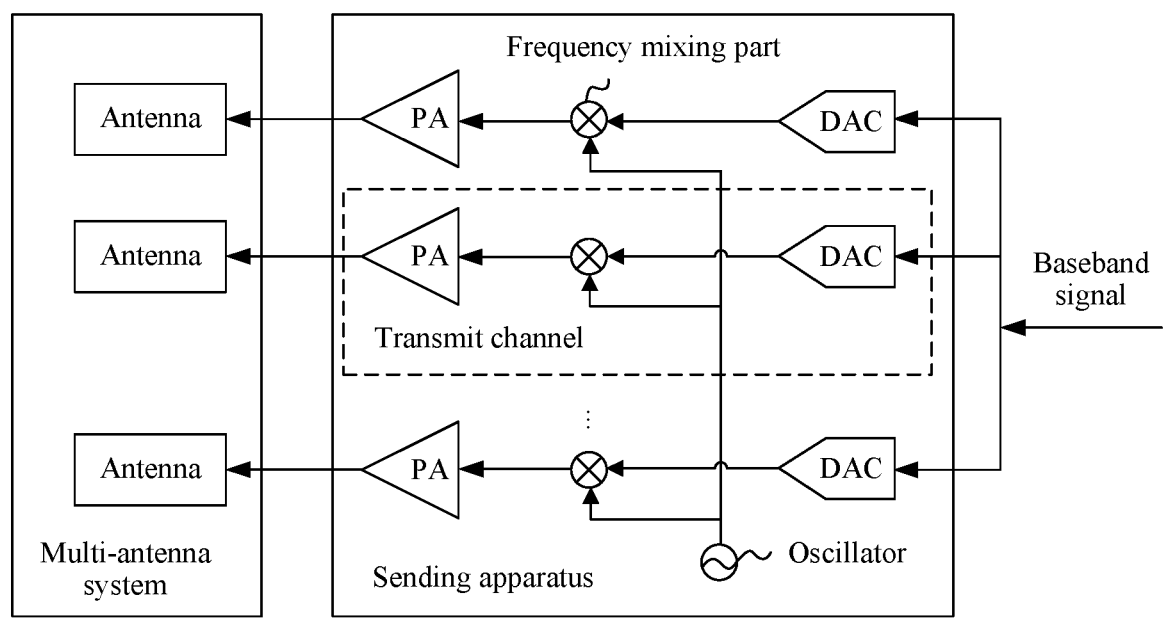
FIG. 3 is a schematic structural diagram of a transmit device according to an embodiment of this application.

With the development of wireless communications technologies, a technical solution in which a same signal is transmitted by using a multi-antenna system is proposed. According to the technical solution, during signal transmission, channel transmission quality can be improved, and a signal transmission rate can be increased. The multi-antenna system includes a plurality of antennas. Any one of the plurality of antennas includes at least one antenna element, and one or more of the plurality of antennas may or may not share an antenna panel, and/or the plurality of antennas may or may not share a radome. This is not limited in the embodiments of this application. The multi-antenna system may alternatively be referred to as a sub-array (sub-array) antenna, an molecular array antenna, an array (array) antenna, an antenna array, or another name, and is mainly used to transmit a same signal by using a plurality of antennas. For example, FIG. 3 is a schematic structural diagram of a transmit device. As shown in FIG. 3, the transmit device includes a plurality of antennas and a sending apparatus. The plurality of antennas are connected to the sending apparatus, and the sending apparatus may alternatively be referred to as a multi-antenna sending apparatus. The plurality of antennas include M antennas, the sending apparatus includes an oscillator and M transmit channels, and the M antennas are in a one-to-one correspondence with the M transmit channels, where M is an integer greater than or equal to 1. A transmit channel includes a PA, a DAC, and a frequency mixing part. When a signal is sent by using the transmit device shown in FIG. 3, the sending apparatus receives one baseband signal, couples the baseband signal to the transmit channels, and uses the baseband signal as a same input signal of the transmit channels. The oscillator generates a carrier signal, and sends the carrier signal to the frequency mixing part in each transmit channel. On each transmit channel of the sending apparatus, the DAC performs digital to analog conversion on the input signal of the transmit channel to obtain a second baseband signal, and sends the second baseband signal to the frequency mixing part. The frequency mixing part performs up-conversion on the second baseband signal based on the carrier signal sent by the oscillator, to obtain a first radio frequency signal, and sends the first radio frequency signal to the PA. The PA performs power amplification on the first radio frequency signal to obtain an amplified radio frequency signal, and sends the amplified radio frequency signal to an antenna corresponding to the transmit channel including the PA, so that the antenna sends the amplified radio frequency signal. In embodiments of this application, that the PA sends the amplified radio frequency signal to the antenna may be understood as that the PA couples the amplified radio frequency signal to an antenna element included in the antenna, and that the antenna sends the amplified radio frequency signal may be understood as that the antenna element included in the antenna sends the amplified radio frequency signal. Because the multi-antenna sending apparatus includes the PAs, amplification of the PAs may be distorted in a non-linear area, and a DPD processor can improve amplification efficiency of the PAs, a pre-distortion processing apparatus may be disposed in the multi-antenna sending apparatus, and the pre-distortion processing apparatus includes a DPD processor configured to improve amplification efficiency of the PAs. Because the multi-antenna sending apparatus includes a plurality of PAs, and different PAs have different non-linear properties, if the multi-antenna sending apparatus still uses a conventional pre-distortion processing technology, an independent DPD processor needs to be disposed for each PA of the pre-distortion processing apparatus. In this case, costs, design complexity, and power consumption of the sending apparatus are greatly increased.

In an example, the pre-distortion processing apparatus provided in embodiments of this application is applied to the multi-antenna sending apparatus. Compared with a pre-distortion processing apparatus in a conventional multi-antenna sending apparatus, the pre-distortion processing apparatus provided in embodiments of this application intends to optimize a structure of the pre-distortion processing apparatus.

In the multi-antenna sending apparatus, because a non-linear property of a PA mainly relies on a structure of the PA and an input signal of the PA, and input signals of the PAs of the multi-antenna sending apparatus are the same, in the multi-antenna sending apparatus using the conventional pre-distortion processing technology, non-linear properties of different PAs are correlated, and performance of DPD processors corresponding to different PAs is correlated. Therefore, the structure of the pre-distortion processing apparatus in the multi-antenna sending apparatus can be optimized, to reduce design complexity, reduce costs, and reduce power consumption of the multi-antenna sending apparatus.

Figure 4:
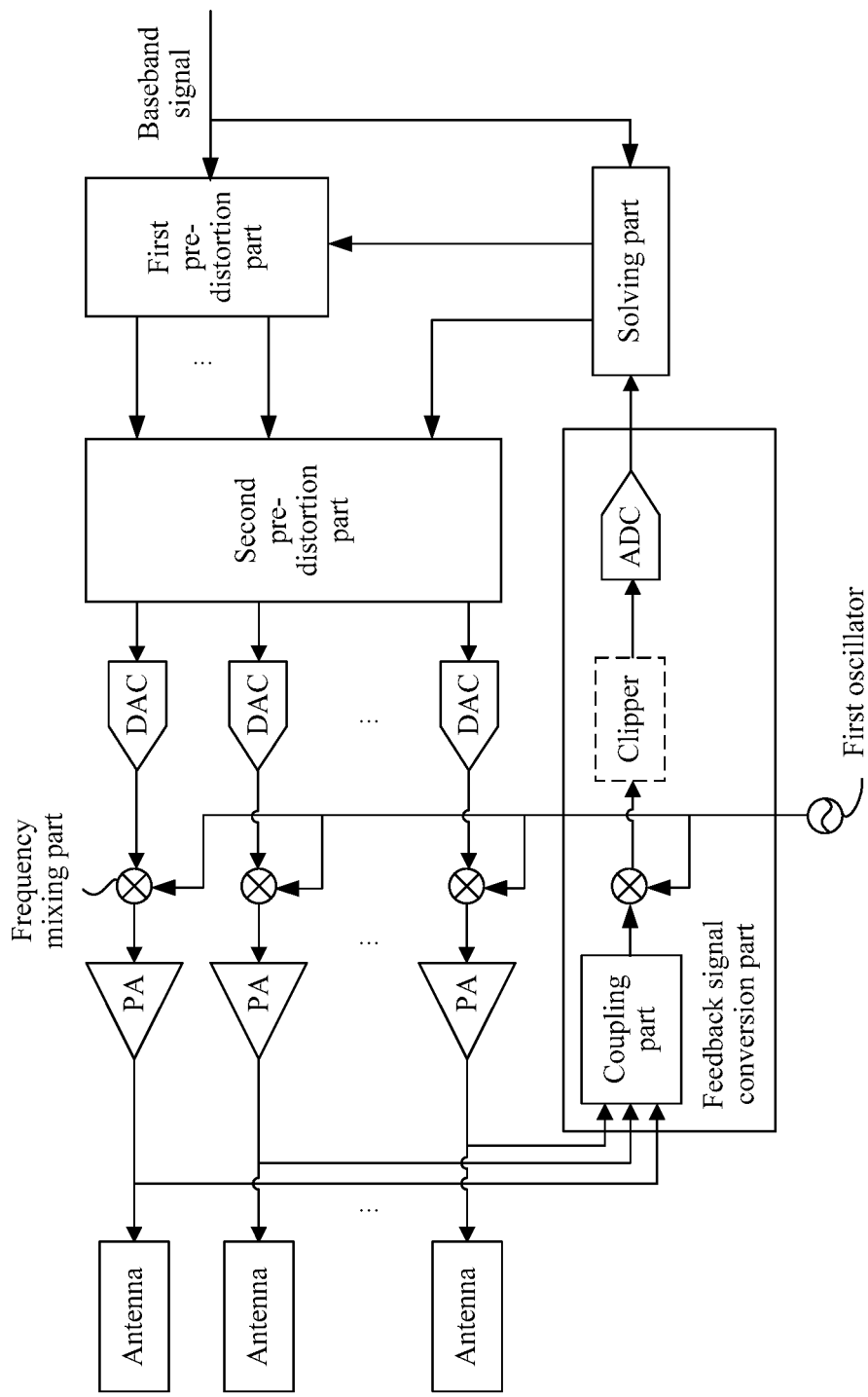
FIG. 4 is a schematic structural diagram of a first pre-distortion processing apparatus according to an embodiment of this application.

FIG. 4 is a schematic structural diagram of a first pre-distortion processing apparatus according to an embodiment of this application.

As shown in FIG. 4, the first pre-distortion processing apparatus provided in the embodiment of this application includes a first pre-distortion part, a second pre-distortion part, a feedback signal conversion part, and a solving part. The first pre-distortion part includes N DPD processors. To show a signal flow direction and a process of processing a signal by the pre-distortion processing apparatus, FIG. 4 further shows a first oscillator, at least one DAC, M frequency mixing parts, M PAs, and M antennas, where N and M are integers, N is greater than or equal to 1, and M is greater than or equal to N.

When the pre-distortion processing apparatus shown in FIG. 4 is applied to a sending apparatus to send a signal, the first pre-distortion part receives one first baseband signal and N sets of pre-distortion parameters. The first baseband signal is a service signal or a digital signal that is specific to the DPD processors. For example, the digital signal specific to the DPD processors is an orthogonal frequency division multiplexing (OFDM) symbol. Further, the first baseband signal may include an I (In-phase, I for short) signal and a Q (Quadrature-phase, Q for short) signal. When the first baseband signal includes the I signal and the Q signal, the signal processing process described in embodiments of this application is performed separately on the I signal and the Q signal. The N sets of pre-distortion parameters are parameters sent by the solving part to the first pre-distortion part. The first pre-distortion part performs digital pre-distortion processing on the first baseband signal based on the N DPD processors and the N sets of pre-distortion parameters to obtain N second baseband signals, and sends the N second baseband signals to the second pre-distortion part. The second pre-distortion part receives the N second baseband signals and a network coefficient, where the network coefficient is a coefficient sent by the solving part to the second pre-distortion part. The second pre-distortion part determines M third baseband signals based on the N second baseband signals and the network coefficient, and sends the M third baseband signals to DACs included in the pre-distortion processing apparatus, that is, sends a $t^{th}$ third baseband signal in the M third baseband signals to one of the DACs included in the pre-distortion processing apparatus, where t is an integer, and a value of t ranges from 1 to M. The DAC included in the pre-distortion processing apparatus receives the M third baseband signals sent by the second pre-distortion part, performs digital to analog conversion on the M third baseband signals to obtain M fourth baseband signals, and sends the M fourth baseband signals to the M frequency mixing parts. In other words, the DAC receiving the $t^{th}$ third baseband signal in the M third baseband signals performs digital to analog conversion on the $t^{th}$ third baseband signal to obtain a $t^{th}$ fourth baseband signal in the M fourth baseband signals, and sends the $t^{th}$ fourth baseband signal to a $t^{th}$ frequency mixing part in the M frequency mixing parts. Optionally, the pre-distortion processing apparatus includes M DACs. Based on such a configuration, the second pre-distortion part sends the $t^{th}$ third baseband signal in the M third baseband signals to a $t^{th}$ DAC in the M DACs, and the $t^{th}$ DAC performs digital to analog conversion on the $t^{th}$ third baseband signal to obtain the $t^{th}$ fourth baseband signal, and sends the $t^{th}$ fourth baseband signal to the $t^{th}$ frequency mixing part, where t is an integer, and a value of t ranges from 1 to M. The first oscillator generates a carrier signal, and sends the carrier signal to the M frequency mixing parts. The M frequency mixing parts receive the carrier signal and the M fourth baseband signals sent by the DACs, perform up-conversion on the M fourth baseband signals based on the carrier signals to obtain M first radio frequency signals, and send the M first radio frequency signals to the M PAs. In other words, the $t^{th}$ frequency mixing part in the M frequency mixing parts receives the carrier signal and the $t^{th}$ fourth baseband signal, where the $t^{th}$ fourth baseband signal is a $t^{th}$ fourth baseband signal in the M fourth baseband signals. The $t^{th}$ frequency mixing part performs up-conversion on the $t^{th}$ fourth baseband signal based on the carrier signal to obtain a $t^{th}$ first radio frequency signal in the M first radio frequency signals, and sends the $t^{th}$ first radio frequency signal to a $t^{th}$ PA in the M PAs, where t is an integer, and a value of t ranges from 1 to M. The M PAs perform power amplification on the M first radio frequency signals to obtain M second radio frequency signals amplified by power amplifiers, send the M second radio frequency signals to the M antennas, and send R second radio frequency signals in the M second radio frequency signals to the feedback signal conversion part, where R is an integer greater than or equal to 1 and less than or equal to M. In other words, the $t^{th}$ PA in the M PAs performs power amplification on the $t^{th}$ first radio frequency signal in the M first radio frequency signals to obtain a $t^{th}$ second radio frequency signal in the M second radio frequency signals amplified by the power amplifiers, sends the $t^{th}$ second radio frequency signal to a $t^{th}$ antenna in the M antennas, and may further send the $t^{th}$ second radio frequency signal to the feedback signal conversion part, where t is an integer, and a value of t ranges from 1 to M. The M antennas send the M second radio frequency signals. In other words, the $t^{th}$ antenna in the M antennas sends the $t^{th}$ second radio frequency signal in the M second radio frequency signals. The R second radio frequency signals amplified by the power amplifiers are coupled to the feedback signal conversion part. In other words, the feedback signal conversion part receives the R second radio frequency signals amplified by the power amplifiers, converts the R second radio frequency signals into one fifth baseband signal, and sends the fifth baseband signal to the solving part. The solving part combines a plurality of pre-distortion parameter solving algorithms in a serial manner, a parallel manner, or a serial manner plus a parallel manner to obtain a solving algorithm of the solving part. The pre-distortion parameter solving algorithm may be an algorithm commonly used by a person skilled in the art, and this is not limited in this application. For example, the algorithm may be a least mean square (LMS) algorithm. The solving part receives the first baseband signal and the fifth baseband signal, determines the N sets of pre-distortion parameters and the network coefficient based on the solving algorithm of the solving part and the fifth baseband signal, sends the N sets of pre-distortion parameters to the first pre-distortion part, and sends the network coefficient to the second pre-distortion part. In embodiments of this application, the network coefficient may alternatively be referred to as a first coefficient, a first parameter, or another name, and is a parameter that is output by the solving part to the second pre-distortion part to support the second pre-distortion part in implementing a pre-distortion processing function.

According to the first pre-distortion processing apparatus provided in embodiments of this application, the first pre-distortion part and the second pre-distortion part implement the pre-distortion processing function, to improve amplification efficiency of M PAs of a multi-antenna sending apparatus. The first pre-distortion part includes the N DPD processors, and is configured to perform digital pre-distortion processing on baseband signals to obtain N signals on which pre-distortion processing has been performed. The second pre-distortion part obtains, based on the N signals on which pre-distortion processing has been performed, M signals on which pre-distortion processing has been performed. The M signals on which pre-distortion processing has been performed are approximately pre-distortion signals opposite to amplification performance of the M PAs, so that for a signal needing to be sent, a signal that is not amplified is in a linear relationship with an amplified signal, to improve amplification efficiency of the PAs. Compared with a pre-distortion processing apparatus in a conventional multi-antenna sending apparatus, according to the first pre-distortion processing apparatus provided in the embodiment of this application, a quantity of DPD processors can be reduced, to optimize a structure of the pre-distortion processing apparatus, and reduce design complexity, costs, and power consumption. Further, in the first pre-distortion processing apparatus provided in the embodiment of this application, a difference between non-linear characteristics of different PAs is considered, so that it can be ensured that functions of signal amplification on transmit channels in the multi-antenna sending apparatus are linear.

Figure 5:
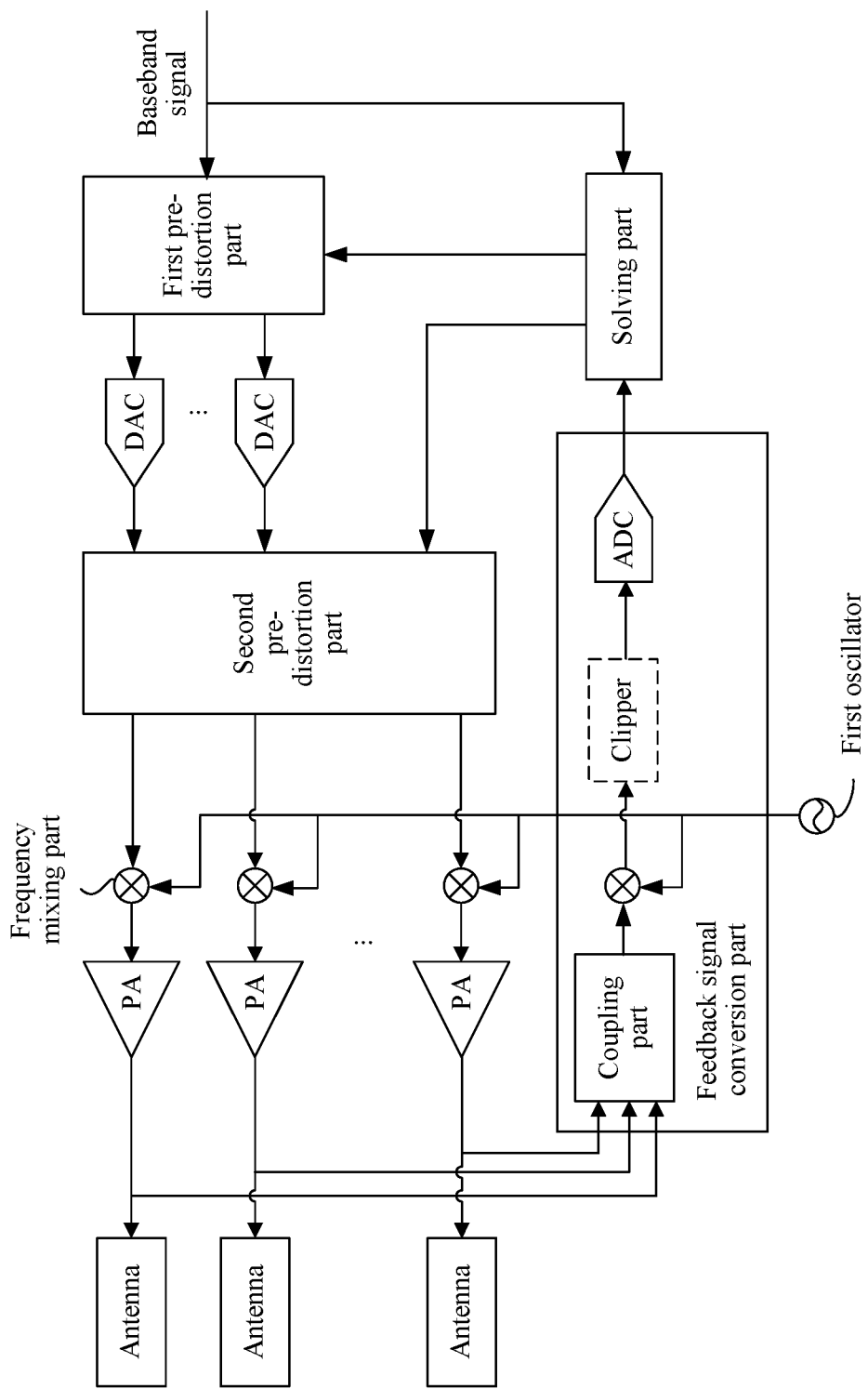
FIG. 5 is a schematic structural diagram of a second pre-distortion processing apparatus according to an embodiment of this application.

FIG. 5 is a schematic structural diagram of a second pre-distortion processing apparatus according to an embodiment of this application.

As shown in FIG. 5, the second pre-distortion processing apparatus provided in the embodiment of this application includes a first pre-distortion part, at least one DAC, a second pre-distortion part, a feedback signal conversion part, and a solving part. The first pre-distortion part includes N DPD processors. To show a signal flow direction and a process of processing a signal by the pre-distortion processing apparatus, FIG. 5 further shows a first oscillator, M frequency mixing parts, M PAs, and M antennas, where N and M are integers, N is greater than or equal to 1, and M is greater than or equal to N. A difference between the second pre-distortion processing apparatus provided in the embodiment of this application and the first pre-distortion processing apparatus is: In the first pre-distortion processing apparatus, during signal processing, digital to analog conversion is performed after the second pre-distortion part processes a signal, that is, the second pre-distortion part sends a signal to the DAC, while in the second pre-distortion processing apparatus, during signal processing, digital to analog conversion is performed before the second pre-distortion part processes a signal, that is, the DAC sends a signal to the second pre-distortion part.

When the pre-distortion processing apparatus shown in FIG. 5 is applied to a sending apparatus to send a signal, the first pre-distortion part receives one first baseband signal and N sets of pre-distortion parameters. The first baseband signal is the same as the first baseband signal described in the pre-distortion processing apparatus corresponding to FIG. 4, and details are not described herein again. The N sets of pre-distortion parameters are parameters sent by the solving part to the first pre-distortion part. The first pre-distortion part performs digital pre-distortion processing on the first baseband signal based on the N DPD processors and the N sets of pre-distortion parameters to obtain N second baseband signals, and sends the N second baseband signals to DACs included in the pre-distortion processing apparatus, that is, sends an $x^{th}$ second baseband signal in the N second baseband signals to one of the DACs included in the pre-distortion processing apparatus, where x is an integer, and a value of x ranges from 1 to N. The DAC included in the pre-distortion processing apparatus performs digital to analog conversion on the N second baseband signals to obtain N third baseband signals, and sends the N third baseband signals to the second pre-distortion part. In other words, the DAC receiving the $x^{th}$ second baseband signal in the N second baseband signals performs digital to analog conversion on the $x^{th}$ second baseband signal to obtain an $x^{th}$ third baseband signal in the N third baseband signals, and sends the $x^{th}$ third baseband signal to the second pre-distortion part. Optionally, the pre-distortion processing apparatus may include N DACs. Based on such a configuration, the first pre-distortion part sends the $x^{th}$ second baseband signal to an $x^{th}$ DAC in the N DACs, and the $x^{th}$ DAC performs digital to analog conversion on the $x^{th}$ second baseband signal to obtain the $x^{th}$ third baseband signal, and sends the $x^{th}$ third baseband signal to the second pre-distortion part, where x is an integer, and a value of x ranges from 1 to N. The second pre-distortion part receives the N third baseband signals and a network coefficient, where the network coefficient is a coefficient sent by the solving part to the second pre-distortion part; determines M fourth baseband signals based on the N third baseband signals and the network coefficient, and sends the M fourth baseband signals to the M frequency mixing parts, that is, sends a $t^{th}$ fourth baseband signal in the M fourth baseband signals to a $t^{th}$ frequency mixing part in the M frequency mixing parts, where t is an integer, and a value of t ranges from 1 to M. The first oscillator generates a carrier signal, and sends the carrier signal to the frequency mixing parts. The M frequency mixing parts receive the M fourth baseband signals and the carrier signal sent by the first oscillator, perform up-conversion on the M fourth baseband signals based on the carrier signal to obtain M first radio frequency signals, and send the M first radio frequency signals to the M PAs. In other words, the $t^{th}$ frequency mixing part in the M frequency mixing parts receives a $t^{th}$ fourth baseband signal in the M fourth baseband signals and the carrier signal sent by the oscillator, performs up-conversion on the $t^{th}$ fourth baseband signal based on the carrier signal to obtain a $t^{th}$ first radio frequency signal in the M first radio frequency signals, and sends the $t^{th}$ first radio frequency signal to a $t^{th}$ PA in the M PAs, where t is an integer, and a value of t ranges from 1 to M. The M PAs perform power amplification on the M first radio frequency signals to obtain M second radio frequency signals amplified by power amplifiers, send the M second radio frequency signals to the M antennas, and send R second radio frequency signals in the M second radio frequency signals to the feedback signal conversion part, where R is an integer greater than or equal to 1 and less than or equal to M. In other words, the $t^{th}$ PA in the M PAs performs power amplification on the $t^{th}$ first radio frequency signal in the M first radio frequency signals to obtain a $t^{th}$ second radio frequency signal in the M second radio frequency signals amplified by the power amplifiers, sends the $t^{th}$ second radio frequency signal to a $t^{th}$ antenna in the M antennas, and may further send the $t^{th}$ second radio frequency signal to the feedback signal conversion part, where t is an integer, and a value of t ranges from 1 to M. The M antennas send the M second radio frequency signals. In other words, the $t^{th}$ antenna in the M antennas sends the $t^{th}$ second radio frequency signal in the M second radio frequency signals, where t is an integer, and a value of t ranges from 1 to M. The R second radio frequency signals amplified by the power amplifiers are coupled to the feedback signal conversion part. In other words, the feedback signal conversion part receives the R second radio frequency signals amplified by the power amplifiers, converts the R second radio frequency signals into one fifth baseband signal, and sends the fifth baseband signal to the solving part. The solving part combines a plurality of pre-distortion parameter solving algorithms in a serial manner, a parallel manner, or a serial manner plus a parallel manner to obtain a solving algorithm of the solving part. The pre-distortion parameter solving algorithm may be an algorithm commonly used by a person skilled in the art, and this is not limited in this application. For example, the algorithm may be an LMS algorithm. The solving part receives the first baseband signal and the fifth baseband signal, determines the N sets of pre-distortion parameters and the network coefficient based on the solving algorithm of the solving part, the first baseband signal, and the fifth baseband signal, sends the N sets of pre-distortion parameters to the first pre-distortion part, and sends the network coefficient to the second pre-distortion part.

Similar to the first pre-distortion processing apparatus provided in the embodiments of this application, the second pre-distortion processing apparatus provided in embodiments of this application implements a pre-distortion processing function by using the first pre-distortion part and the second pre-distortion part, to improve amplification efficiency of M PAs of a multi-antenna sending apparatus. The pre-distortion processing apparatus can not only reduce design complexity, costs, and power consumption, but also ensure that functions of signal amplification on transmit channels in the multi-antenna sending apparatus are linear.

The first pre-distortion part shown in FIG. 4 or FIG. 5 includes the N DPD processors, and is configured to: receive the first baseband signal and the N sets of pre-distortion parameters, and perform digital pre-distortion processing on the first baseband signal based on the N DPD processors and the N sets of pre-distortion parameters to obtain the N second baseband signals. Specifically, the first pre-distortion part of the pre-distortion processing apparatus shown in FIG. 4 or FIG. 5 is any one of a plurality of implementations of a first pre-distortion part shown in FIG. 6 to FIG. 9.

Figure 6:
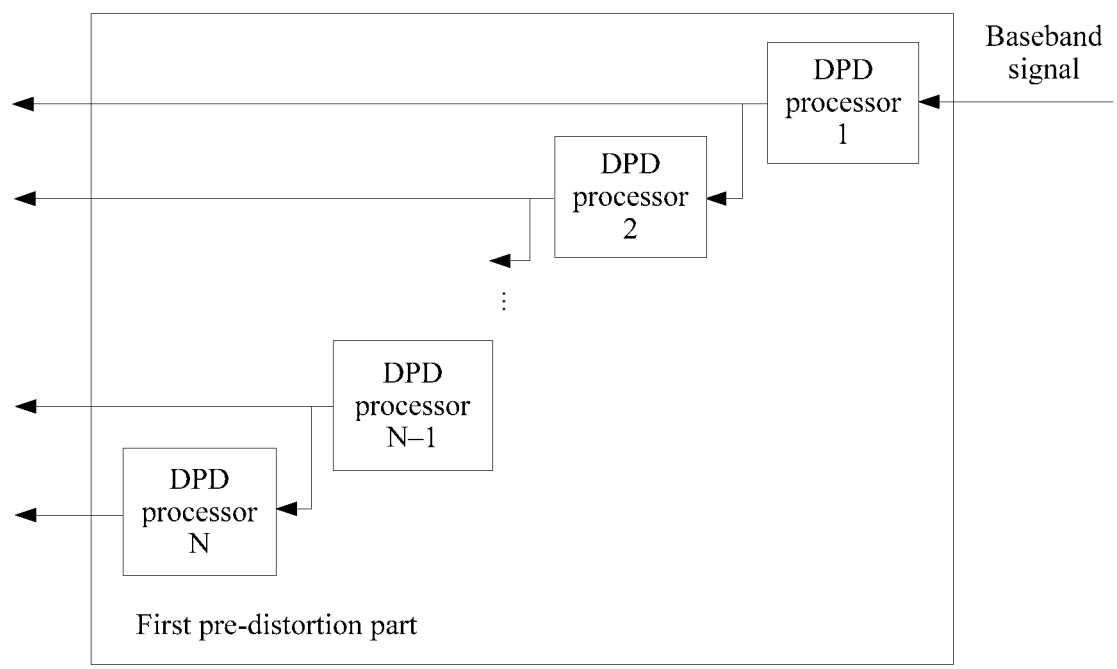
FIG. 6 is a first schematic structural diagram of a first pre-distortion part according to an embodiment of this application.

A first pre-distortion part shown in FIG. 6 is a first implementation of the first pre-distortion part of the pre-distortion processing apparatus shown in FIG. 4 or FIG. 5. As shown in FIG. 6, the first pre-distortion part includes N DPD processors, and an $x^{th}$ DPD processor in the N DPD processors receives an $x^{th}$ set of pre-distortion parameters in N sets of pre-distortion parameters and an $x^{th}$ DPD processor input signal, and performs digital pre-distortion processing on the $x^{th}$ DPD processor input signal based on the $x^{th}$ set of pre-distortion parameters to obtain an $x^{th}$ second baseband signal in N second baseband signals. When the first pre-distortion part shown in FIG. 6 is applied to the pre-distortion processing apparatus shown in FIG. 4, the $x^{th}$ DPD processor sends the $x^{th}$ second baseband signal to the second pre-distortion part of the pre-distortion processing apparatus shown in FIG. 4. When the first pre-distortion part shown in FIG. 6 is applied to the pre-distortion processing apparatus shown in FIG. 5, the $x^{th}$ DPD processor sends the $x^{th}$ second baseband signal to one of DACs included in the pre-distortion processing apparatus shown in FIG. 5. When x is 1, the $x^{th}$ DPD processor input signal is a first baseband signal, or when x is any one of 2 to N, the $x^{th}$ DPD processor input signal is an $(x-1)^{th}$ second baseband signal sent by an $(x-1)^{th}$ DPD processor in the N DPD processors, and the $(x-1)^{th}$ second baseband signal is an $(x-1)^{th}$ second baseband signal in the N second baseband signals, where x is an integer, and a value of x ranges from 1 to N. In the first implementation of the first pre-distortion part, the DPD processors are cascaded to perform pre-distortion processing on signals to obtain N signals on which pre-distortion processing has been performed. This implementation has a relatively simple design, relatively low costs, and relatively low power consumption.

Figure 7:
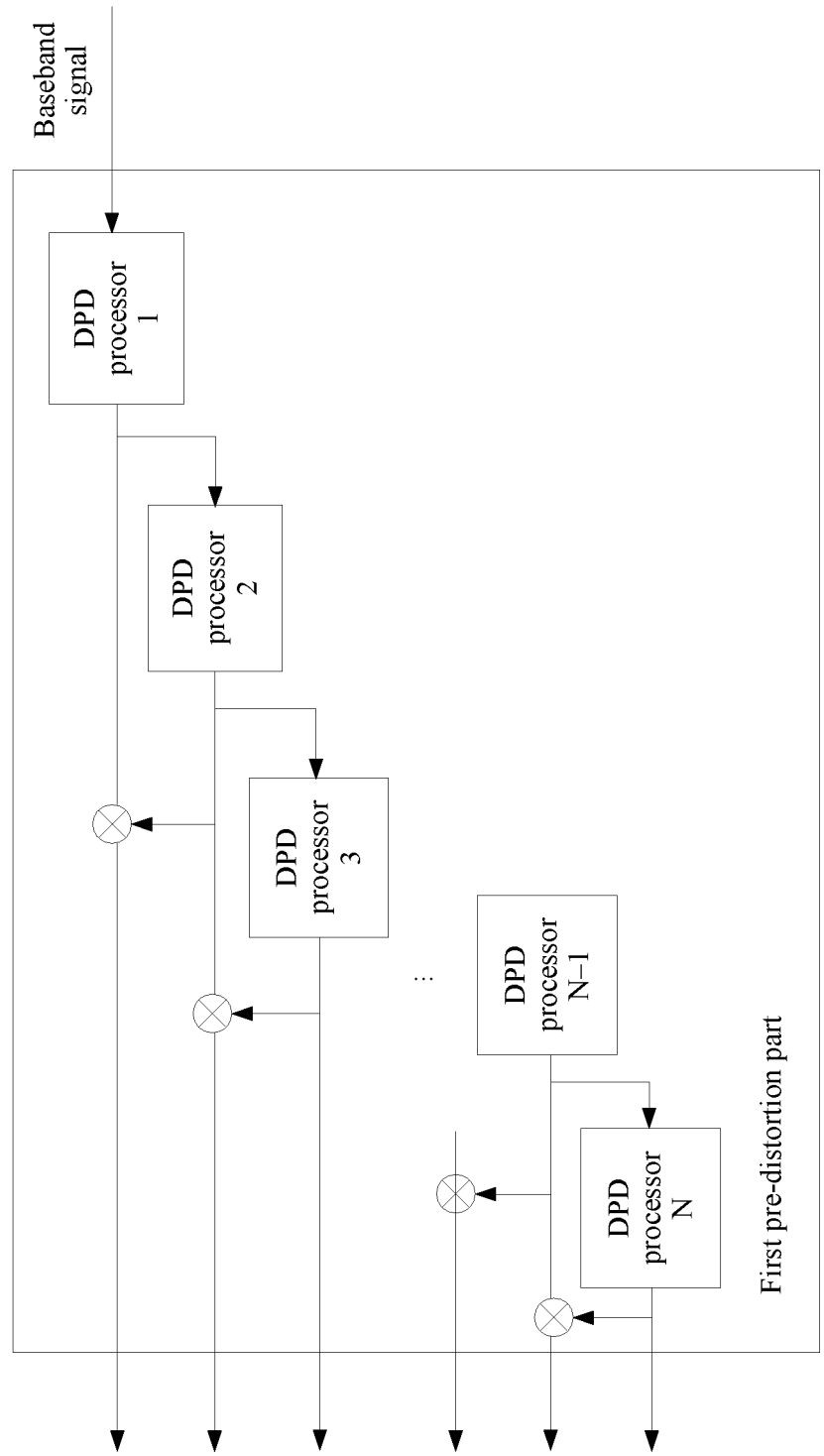
FIG. 7 is a second schematic structural diagram of a first pre-distortion part according to an embodiment of this application.

A first pre-distortion part shown in FIG. 7 is a second implementation of the first pre-distortion part of the pre-distortion processing apparatus shown in FIG. 4 or FIG. 5. As shown in FIG. 7, the first pre-distortion part includes N DPD processors and N−1 multipliers.

An $x^{th}$ DPD processor in the N DPD processors receives an $x^{th}$ set of pre-distortion parameters in N sets of pre-distortion parameters and an $x^{th}$ DPD processor input signal. The $x^{th}$ DPD processor input signal is an $x^{th}$ DPD processor input signal in N DPD processor input signals. The $x^{th}$ DPD processor performs digital pre-distortion processing on the $x^{th}$ DPD processor input signal based on the $x^{th}$ set of pre-distortion parameters to obtain an $x^{th}$ DPD processor output signal, where the $x^{th}$ DPD processor output signal is an $x^{th}$ DPD processor output signal in N DPD processor output signals, x is an integer, and a value of x ranges from 1 to N. When x is 1, the $x^{th}$ DPD processor input signal is a first baseband signal, or when x is any one of 2 to N, the $x^{th}$ DPD processor input signal received by the $x^{th}$ DPD processor is specifically an $(x-1)^{th}$ DPD processor output signal sent by an $(x-1)^{th}$ DPD processor in the N DPD processors, and the $(x-1)^{th}$ DPD processor output signal is an $(x-1)^{th}$ DPD processor output signal in the N DPD processor output signals, where x is an integer, and a value of x ranges from 1 to N.

A $y^{th}$ multiplier in the N−1 multipliers receives a $y^{th}$ DPD processor output signal sent by a $y^{th}$ DPD processor in the N DPD processors and a $(y+1)^{th}$ DPD processor output signal sent by a $(y+1)^{th}$ DPD processor in the N DPD processors, and multiplies the $y^{th}$ DPD processor output signal by the $(y+1)^{th}$ DPD processor output signal to obtain a $y^{th}$ second baseband signal in N second baseband signals. The $y^{th}$ DPD processor output signal is a $y^{th}$ DPD processor output signal in the N DPD processor output signals, and the $(y+1)^{th}$ DPD processor output signal is a $(y+1)^{th}$ DPD processor output signal in the N DPD processor output signals. When the first pre-distortion part shown in FIG. 7 is applied to the pre-distortion processing apparatus shown in FIG. 4, the $y^{th}$ multiplier sends the $y^{th}$ second baseband signal to the second pre-distortion part of the pre-distortion processing apparatus shown in FIG. 4. When the first pre-distortion part shown in FIG. 7 is applied to the pre-distortion processing apparatus shown in FIG. 5, the $y^{th}$ multiplier sends the $y^{th}$ second baseband signal to one of DACs included in the pre-distortion processing apparatus shown in FIG. 5, where y is an integer, and a value of y ranges from 1 to N−1.

When x is N, the $x^{th}$ DPD processor output signal in the N DPD processor output signals is an $x^{th}$ second baseband signal in the N second baseband signals. In this case, when the first pre-distortion part shown in FIG. 7 is applied to the pre-distortion processing apparatus shown in FIG. 4, the $x^{th}$ DPD processor in the N DPD processors is further configured to send the $x^{th}$ second baseband signal to the second pre-distortion part of the pre-distortion processing apparatus shown in FIG. 4; or when the first pre-distortion part shown in FIG. 7 is applied to the pre-distortion processing apparatus shown in FIG. 5, the $x^{th}$ DPD processor in the N DPD processors is further configured to send the $x^{th}$ second baseband signal to one of the DACs included in the pre-distortion processing apparatus shown in FIG. 5. In the second implementation of the first pre-distortion part, the DPD processors perform pre-distortion processing on signals, and the multipliers perform feedback complex multiplication on signals to obtain N signals on which pre-distortion processing has been performed. During signal amplification, this implementation intends to more effectively reduce non-linear distortion and improve amplification efficiency in a scenario in which there is significant non-linear distortion.

Figure 8:
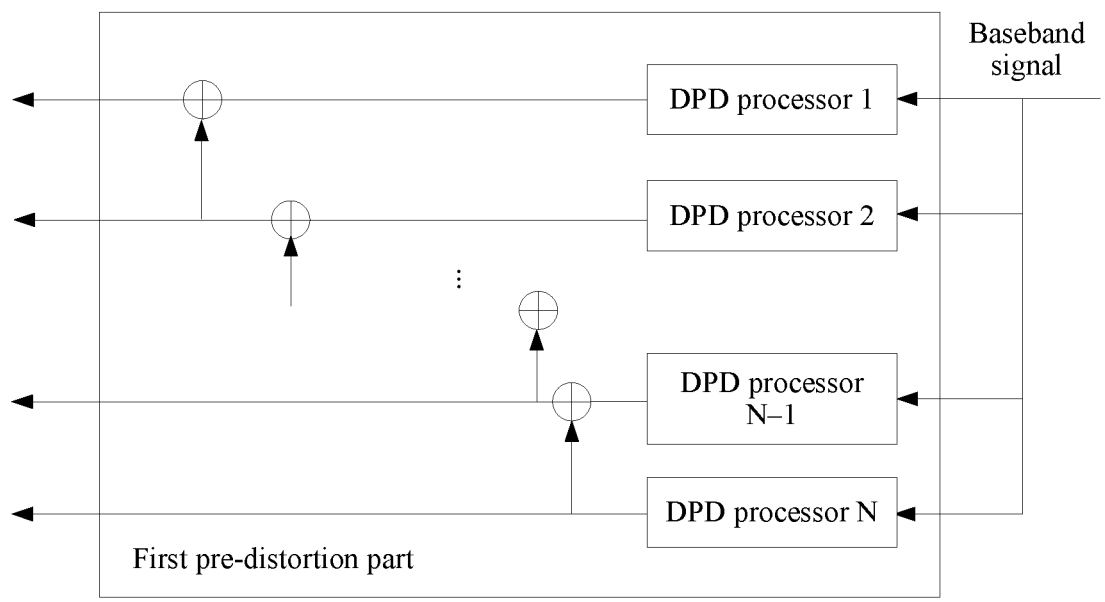
FIG. 8 is a third schematic structural diagram of a first pre-distortion part according to an embodiment of this application.

A first pre-distortion part shown in FIG. 8 is a third implementation of the first pre-distortion part of the pre-distortion processing apparatus shown in FIG. 4 or FIG. 5. As shown in FIG. 8, the first pre-distortion part includes N DPD processors and N−1 adders.

An $x^{th}$ DPD processor in the N DPD processors receives an $x^{th}$ set of pre-distortion parameters in N sets of pre-distortion parameters and a first baseband signal, and performs digital pre-distortion processing on the first baseband signal based on the $x^{th}$ set of pre-distortion parameters to obtain an $x^{th}$ DPD processor output signal in N DPD processor output signals, where x is an integer, and a value of x ranges from 1 to N.

A $y^{th}$ adder in the N−1 adders receives a $y^{th}$ DPD processor output signal sent by a $y^{th}$ DPD processor in the N DPD processors and a $(y+1)^{th}$ DPD processor output signal sent by a $(y+1)^{th}$ DPD processor in the N DPD processors, and adds the $y^{th}$ DPD processor output signal and the $(y+1)^{th}$ DPD processor output signal to obtain a $y^{th}$ second baseband signal in the N second baseband signals. The $y^{th}$ DPD processor output signal is a $y^{th}$ DPD processor output signal in the N DPD processor output signals, and the $(y+1)^{th}$ DPD processor output signal is a $(y+1)^{th}$ DPD processor output signal in the N DPD processor output signals. When the first pre-distortion part shown in FIG. 8 is applied to the pre-distortion processing apparatus shown in FIG. 4, the $y^{th}$ adder sends the $y^{th}$ second baseband signal to the second pre-distortion part of the pre-distortion processing apparatus shown in FIG. 4. When the first pre-distortion part shown in FIG. 8 is applied to the pre-distortion processing apparatus shown in FIG. 5, the $y^{th}$ adder sends the $y^{th}$ second baseband signal to one of DACs included in the pre-distortion processing apparatus shown in FIG. 5, where y is an integer, and a value of y ranges from 1 to N−1.

When x is N, the $x^{th}$ DPD processor output signal in the N DPD processor output signals is an $x^{th}$ second baseband signal in the N second baseband signals. In this case, when the first pre-distortion part shown in FIG. 8 is applied to the pre-distortion processing apparatus shown in FIG. 4, the $x^{th}$ DPD processor in the N DPD processors is further configured to send the $x^{th}$ second baseband signal to the second pre-distortion part of the pre-distortion processing apparatus shown in FIG. 4; or when the first pre-distortion part shown in FIG. 8 is applied to the pre-distortion processing apparatus shown in FIG. 5, the $x^{th}$ DPD processor in the N DPD processors is further configured to send the $x^{th}$ second baseband signal to one DAC in the at least one DAC included in the pre-distortion processing apparatus shown in FIG. 5. In the third implementation of the first pre-distortion part, the DPD processors perform pre-distortion processing on signals, and the adders perform feedback complex adding on signals to obtain N signals on which pre-distortion processing has been performed. During signal amplification, this implementation intends to more effectively reduce non-linear distortion and improve amplification efficiency in a scenario in which there is significant non-linear distortion.

Figure 9:
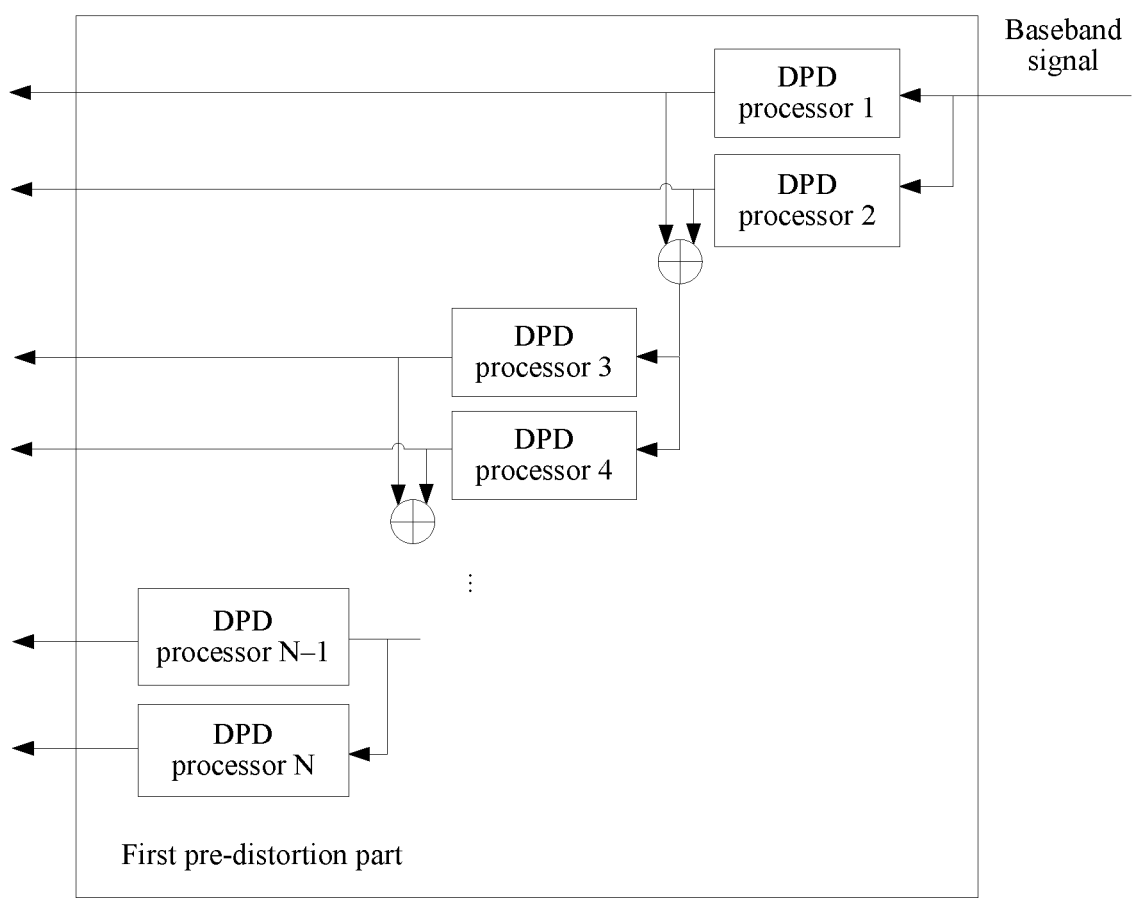
FIG. 9 is a fourth schematic structural diagram of a first pre-distortion part according to an embodiment of this application.

A first pre-distortion part shown in FIG. 9 is a fourth implementation of the first pre-distortion part of the pre-distortion processing apparatus shown in FIG. 4 or FIG. 5. As shown in FIG. 9, the first pre-distortion part includes N DPD processors and L adders, where L is equal to a value obtained by rounding ((N−2)/2) up to the next integer.

An $x^{th}$ DPD processor in the N DPD processors receives an $x^{th}$ set of pre-distortion parameters in N sets of pre-distortion parameters and an $x^{th}$ DPD processor input signal. The $x^{th}$ DPD processor input signal is an $x^{th}$ DPD processor input signal in N DPD processor input signals. The $x^{th}$ DPD processor performs digital pre-distortion processing on the $x^{th}$ DPD processor input signal based on the $x^{th}$ set of pre-distortion parameters to obtain an $x^{th}$ second baseband signal in N second baseband signals. When the first pre-distortion part shown in FIG. 9 is applied to the pre-distortion processing apparatus shown in FIG. 4, the $x^{th}$ DPD processor sends the $x^{th}$ second baseband signal to the second pre-distortion part of the pre-distortion processing apparatus shown in FIG. 4. When the first pre-distortion part shown in FIG. 9 is applied to the pre-distortion processing apparatus shown in FIG. 5, the $x^{th}$ DPD processor sends the $x^{th}$ second baseband signal to one of DACs included in the pre-distortion processing apparatus shown in FIG. 5.

When x is 1 or 2, the first baseband signal is the $x^{th}$ DPD processor input signal, or when x is any one of 2 to N, the $x^{th}$ DPD processor input signal is obtained by a corresponding adder in the L adders.

A $p^{th}$ adder in the L adders receives a $(2p-1)^{th}$ second baseband signal that is in the N second baseband signals and that is sent by a $(2p-1)^{th}$ DPD processor in the N DPD processors and a $2p^{th}$ second baseband signal that is in the N second baseband signals and that is sent by a $2p^{th}$ DPD processor in the N DPD processors, and adds the $(2p-1)^{th}$ second baseband signal and the $2p^{th}$ second baseband signal to obtain a $(2p+1)^{th}$ DPD processor input signal and a $(2p+2)^{th}$ DPD processor input signal in the N DPD processor input signals; that is, the $(2p+1)^{th}$ DPD processor input signal is the same as the $(2p+2)^{th}$ DPD processor input signal. The $p^{th}$ adder sends the $(2p+1)^{th}$ DPD processor input signal and the $(2p+2)^{th}$ DPD processor input signal to a $(2p+1)^{th}$ DPD processor and a $(2p+2)^{th}$ DPD processor in the N DPD processors, where p is an integer, and a value of p ranges from 1 to L−1.

When L is a multiple of 2, an $L^{th}$ adder in the L adders receives a $(2L-1)^{th}$ second baseband signal that is in the N second baseband signals and that is sent by a $(2L-1)^{th}$ DPD processor in the N DPD processors and a $2L^{th}$ second baseband signal that is in the N second baseband signals and that is sent by a $2L^{th}$ DPD processor in the N DPD processors, and adds the $(2L-1)^{th}$ second baseband signal and the $2L^{th}$ second baseband signal to obtain a $(2L+1)^{th}$ DPD processor input signal and a $(2L+2)^{th}$ DPD processor input signal in the N DPD processor input signals; that is, the $(2L+1)^{th}$ DPD processor input signal is the same as the $(2L+2)^{th}$ DPD processor input signal. The $L^{th}$ adder sends the $(2L+1)^{th}$ DPD processor input signal and the $(2L+2)^{th}$ DPD processor input signal to a $(2L+1)^{th}$ DPD processor and a $(2L+2)^{th}$ DPD processor in the N DPD processors.

When L is not a multiple of 2, an $Lt^h$ adder in the L adders receives a $(2L-1)^{th}$ second baseband signal that is in the N second baseband signals and that is sent by a $(2L-1)^{th}$ DPD processor in the N DPD processors and a $2L^{th}$ second baseband signal that is in the N second baseband signals and that is sent by a $2L^{th}$ DPD processor in the N DPD processors, adds the $(2L-1)^{th}$ second baseband signal and the $2L^{th}$ second baseband signal to obtain a $(2L+1)^{th}$ DPD processor input signal in the N DPD processor input signals, and sends the $(2L+1)^{th}$ DPD processor input signal to a $(2L+1)^{th}$ DPD processor in the N DPD processors, where 2L+1 is equal to N. In the fourth implementation of the first pre-distortion part, the DPD processors perform pre-distortion processing on signals, and the adders perform feedback complex adding on signals to obtain N signals on which pre-distortion processing has been performed. During signal amplification, this implementation intends to more effectively reduce non-linear distortion and improve amplification efficiency in a scenario in which there is significant non-linear distortion.

Figure 10:
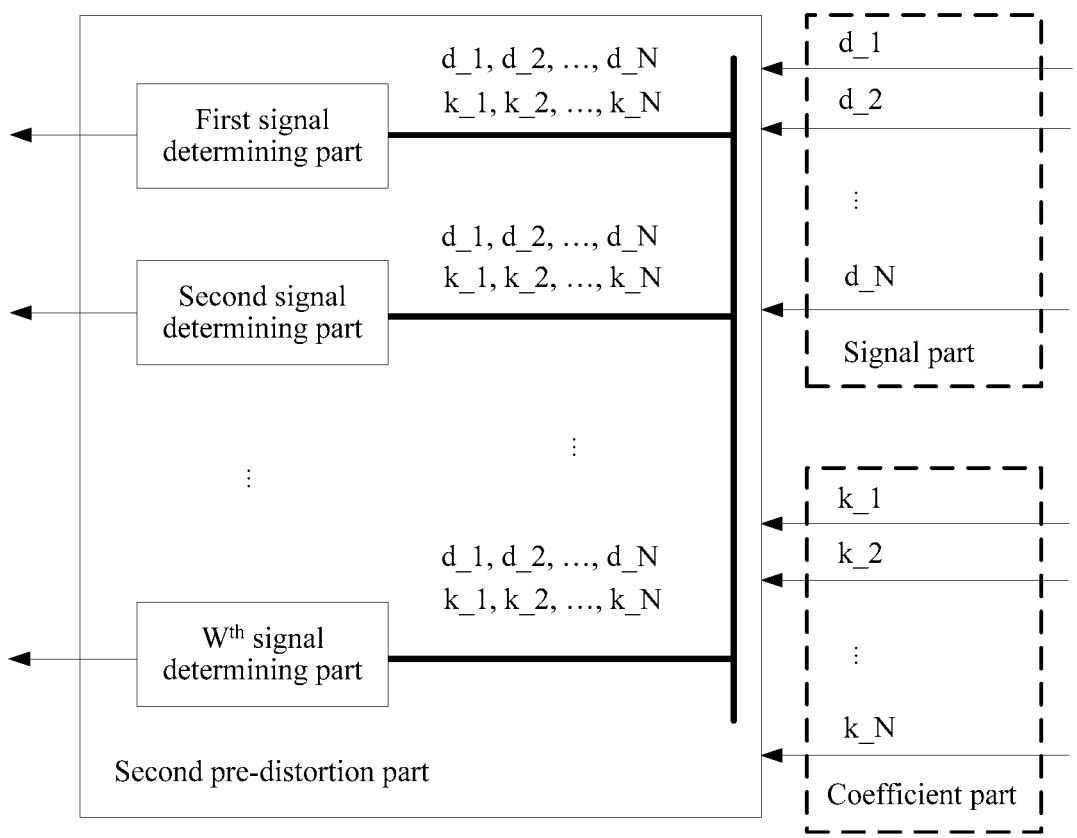
FIG. 10 is a schematic structural diagram of a second pre-distortion part according to an embodiment of this application.

A second pre-distortion part shown in FIG. 10 is the second pre-distortion part of the pre-distortion processing apparatus shown in FIG. 4 or FIG. 5. When the second pre-distortion part shown in FIG. 10 is applied to the pre-distortion processing apparatus shown in FIG. 4, "N input signals" described in the second pre-distortion part corresponding to FIG. 10 are the "N second baseband signals" described in the pre-distortion processing apparatus corresponding to FIG. 4, a "network coefficient" described in the second pre-distortion part corresponding to FIG. 10 is the "network coefficient" described in the pre-distortion processing apparatus corresponding to FIG. 4, and "M output signals" described in the second pre-distortion part corresponding to FIG. 10 are the "M third baseband signals" described in the pre-distortion processing apparatus corresponding to FIG. 4. When the second pre-distortion part shown in FIG. 10 is applied to the pre-distortion processing apparatus shown in FIG. 5, "N input signals" described in the second pre-distortion part corresponding to FIG. 10 are the "N third baseband signals" described in the pre-distortion processing apparatus corresponding to FIG. 5, a "network coefficient" described in the second pre-distortion part corresponding to FIG. 10 is the "network coefficient" described in the pre-distortion processing apparatus corresponding to FIG. 5, and "M output signals" described in the second pre-distortion part corresponding to FIG. 10 are the "M fourth baseband signals" described in the pre-distortion processing apparatus corresponding to FIG. 5.

As shown in FIG. 10, the second pre-distortion part includes W signal determining parts; and an $e^{th}$ signal determining part in the W signal determining parts receives the N input signals and the network coefficient, and determines an $e^{th}$ second pre-distortion part output signal based on the N input signals and the network coefficient, where the $e^{th}$ second pre-distortion part output signal corresponds to at least one of the M output signals, e is an integer, a value of e ranges from 1 to W, and W is an integer less than or equal to M. When the second pre-distortion part shown in FIG. 10 is applied to the pre-distortion processing apparatus shown in FIG. 4, the signal determining parts of the second pre-distortion part are connected to the DAC of the pre-distortion processing apparatus shown in FIG. 4. If the $e^{th}$ signal determining part is connected to one DAC, a function of the DAC includes: receiving a $t^{th}$ output signal in the M output signals. The $e^{th}$ second pre-distortion part output signal corresponds to the $t^{th}$ output signal in the M output signals, that is, the $e^{th}$ second pre-distortion part output signal is the $t^{th}$ output signal in the M output signals. The $e^{th}$ signal determining part couples the $t^{th}$ output signal to the DAC connected to the signal determining part. When the second pre-distortion part shown in FIG. 10 is applied to the pre-distortion processing apparatus shown in FIG. 5, one signal determining part of the second pre-distortion part is connected to at least one frequency mixing part of the pre-distortion processing apparatus shown in FIG. 5, and one frequency mixing part is connected to one signal determining part. When the signal determining parts are connected to the frequency mixing parts in a one-to-one correspondence, W is equal to M; or when one signal determining part is connected to a plurality of frequency mixing parts, W is less than M. If the $e^{th}$ signal determining part is connected to a $t^{th}$ frequency mixing part in the M frequency mixing parts of the pre-distortion processing apparatus shown in FIG. 5, the $e^{th}$ second pre-distortion part output signal corresponds to the $t^{th}$ output signal in the M output signals, that is, the $e^{th}$ second pre-distortion part output signal is the $t^{th}$ output signal in the M output signals. The $e^{th}$ signal determining part sends the $t^{th}$ output signal to the $t^{th}$ frequency mixing part in the M frequency mixing parts of the pre-distortion processing apparatus shown in FIG. 5, where t is an integer greater than or equal to 1 and less than or equal to M.

For example, the N input signals are denoted as $d\_x$, where x is an integer, and a value of x ranges from 1 to N. In other words, the N input signals are $d\_1, d\_2, \ldots,$ and $d\_N$. The network coefficient is denoted as K, and includes N coefficients $k\_x$, where x is an integer, and a value of x ranges from 1 to N. In other words, the network coefficient K includes $k\_1, k\_2, \ldots,$ and $k\_N$. The $e^{th}$ signal determining part included in the second pre-distortion part performs linear transformation on $d\_1, d\_2, \ldots, d\_N, k\_1, k\_2, \ldots,$ and $k\_N$ to obtain the $e^{th}$ second pre-distortion part output signal. The linear transformation includes an adding operation and a multiplication operation. According to the second pre-distortion part shown in FIG. 10, M signals on which pre-distortion processing has been performed may be obtained through linear transformation, and the M signals on which pre-distortion processing has been performed are approximately pre-distortion signals opposite to amplification performance of M PAs of a multi-antenna sending apparatus, so that for a signal needing to be sent, a signal that is not amplified is in a linear relationship with an amplified signal, to improve amplification efficiency of the PAs of the multi-antenna sending apparatus. Compared with a pre-distortion processing apparatus in a conventional multi-antenna sending apparatus, according to the pre-distortion processing apparatus provided in the embodiment of this application, M-N DPD processors are reduced, to optimize a structure of the pre-distortion processing apparatus, and reduce design complexity, costs, and power consumption. In addition, a difference between non-linear characteristics of different PAs is considered, so that it can be ensured that functions of signal amplification on transmit channels in the multi-antenna sending apparatus are linear.

The following describes, with reference to FIG. 4 or FIG. 5, the feedback signal conversion part of the pre-distortion processing apparatus shown in FIG. 4 or FIG. 5, and the feedback signal conversion part is ether of the following two implementations. When the feedback signal conversion parts in the following two implementations are applied to the pre-distortion processing apparatus shown in FIG. 4, a "pre-distortion processing apparatus" described in the following two implementations is the pre-distortion processing apparatus corresponding to FIG. 4. When the feedback signal conversion parts in the following two implementations are applied to the pre-distortion processing apparatus shown in FIG. 5, a "pre-distortion processing apparatus" described in the following two implementations is the pre-distortion processing apparatus corresponding to FIG. 5.

A first implementation of the feedback signal conversion part is: The feedback signal conversion part includes a coupling part, a frequency mixing part, and an ADC. The coupling part receives R radio frequency signals amplified by power amplifiers, obtains one coupling part output signal based on the R radio frequency signals amplified by the power amplifiers, and sends the coupling part output signal to the frequency mixing part. A method for obtaining, by the coupling part, the coupling part output signal based on the R radio frequency signals amplified by the power amplifiers may be a method commonly used by a person skilled in the art. For example, the coupling part may select, by using a time division method, one signal from the R radio frequency signals amplified by the power amplifiers, and use the signal as the coupling part output signal; or may obtain, by using an average obtaining method, one signal based on the R radio frequency signals amplified by the power amplifiers, and use the signal as the coupling part output signal; or may obtain, by using a linear combination method, one signal based on the R radio frequency signals amplified by the power amplifiers, and use the signal as the coupling part output signal. This is not limited in this application. The frequency mixing part of the feedback signal conversion part performs down-conversion on the coupling part output signal based on a carrier signal to obtain a sixth baseband signal, and sends the sixth baseband signal to the ADC of the feedback signal conversion part. The ADC of the feedback signal conversion part performs analog to digital conversion on the sixth baseband signal to obtain a fifth baseband signal, and sends the fifth baseband signal to a solving part of a pre-distortion processing apparatus. The carrier signal may be a carrier signal that is sent by a first oscillator of the pre-distortion processing apparatus to the frequency mixing part of the feedback signal conversion part. Optionally, the pre-distortion processing apparatus may further include a second oscillator, and the carrier signal may alternatively be a carrier signal that is sent by the second oscillator to the frequency mixing part of the feedback signal conversion part. In the first implementation of the feedback signal conversion part, the radio frequency signals amplified by the power amplifiers may be fed back to the solving part of the pre-distortion processing apparatus, so that the solving part can obtain a network coefficient and N sets of pre-distortion parameters, and can support the first pre-distortion part and the second pre-distortion part in performing pre-distortion processing.

A second implementation of the feedback signal conversion part is: The feedback signal conversion part includes a coupling part, a frequency mixing part, a clipper, and an ADC. The coupling part receives R radio frequency signals amplified by power amplifiers, obtains one coupling part output signal based on the R radio frequency signals amplified by the power amplifiers, and sends the coupling part output signal to the frequency mixing part of the feedback signal conversion part. A method for obtaining, by the coupling part, the coupling part output signal based on the R radio frequency signals amplified by the power amplifiers may be a method commonly used by a person skilled in the art. The method is the same as the corresponding description in the first implementation of the feedback signal conversion part, and details are not described herein again. The frequency mixing part of the feedback signal conversion part performs down-conversion on the coupling part output signal based on a carrier signal to obtain a sixth baseband signal, and sends the sixth baseband signal to the clipper. The clipper performs amplitude limiting processing on the sixth baseband signal to obtain a seventh baseband signal, and sends the seventh baseband signal to the ADC of the feedback signal conversion part. The ADC of the feedback signal conversion part performs analog to digital conversion on the seventh baseband signal to obtain a fifth baseband signal, and sends the fifth baseband signal to the solving part of the digital pre-distortion processing apparatus shown in FIG. 4. The carrier signal may be a carrier signal that is sent by a first oscillator of the pre-distortion processing apparatus to the frequency mixing part of the feedback signal conversion part. The pre-distortion processing apparatus may further include a second oscillator, and the carrier signal may alternatively be a carrier signal that is sent by the second oscillator to the frequency mixing part of the feedback signal conversion part. Similar to the first implementation of the feedback signal conversion part, the second implementation of the feedback signal conversion part supports the first pre-distortion part and the second pre-distortion part can be supported in performing pre-distortion processing. Compared with the first implementation of the feedback signal conversion part, in the second implementation of the feedback signal conversion part, the clipper is added. When an amplitude of a signal is relatively high, the added clipper may perform amplitude limiting processing on the signal, to reduce interference caused by a wave peak of the signal to a wave trough of the signal, and further reduce a damage caused by an excessively high signal amplitude or excessively high interference to the ADC.

It should be noted that the pre-distortion processing apparatuses shown in FIG. 4 to FIG. 10 or components included in the pre-distortion processing apparatuses include only key components for implementing the embodiments of this application, and another software and hardware processing module may be further disposed between parts and/or devices based on a system requirement. For example, a duplexer may be further disposed between a PA and an antenna, and a filter may be further disposed between a frequency mixing part and an ADC.

The pre-distortion processing apparatuses shown in FIG. 4 to FIG. 10 or each component included in the pre-distortion processing apparatuses may be a circuit. The circuit may be implemented by using a chip system. The chip system may include a central processing unit (CPU), a general-purpose processor, a network processor (NP), a digital signal processor (DSP), an application-specific integrated circuit (ASIC), a programmable logic device (PLD), a transistor logic device, a discrete device, a hardware component, or any combination of the foregoing devices. The PLD may be a complex programmable logic device (CPLD t), a field-programmable gate array (FPGA), a generic array logic (GAL), or any combination thereof. The chip system may implement or execute various example logical blocks, modules, and circuits described in content disclosed in this application. The chip system may alternatively be a combination for implementing a computing function, for example, a combination including at least one microprocessor or a combination of a DSP and a microprocessor. In a specific example, the pre-distortion processing apparatus provided in the embodiments of this application may be jointly implemented by using a baseband chip and a radio frequency chip. The baseband chip is a device processing a baseband signal in the foregoing embodiments, and the radio frequency chip is a device for processing a radio frequency signal in the foregoing embodiment. Optionally, the radio frequency chip may further include a chip for processing an intermediate frequency signal and a chip processing a radio frequency signal.

The foregoing mainly describes the pre-distortion processing apparatus provided in the embodiments of this application, and the pre-distortion processing apparatus is a possible implementation of a pre-distortion processing method provided in the embodiments of this application. The following describes, with reference to FIG. 11 and FIG. 12, the pre-distortion processing method provided in the embodiments of this application.

Figure 11:
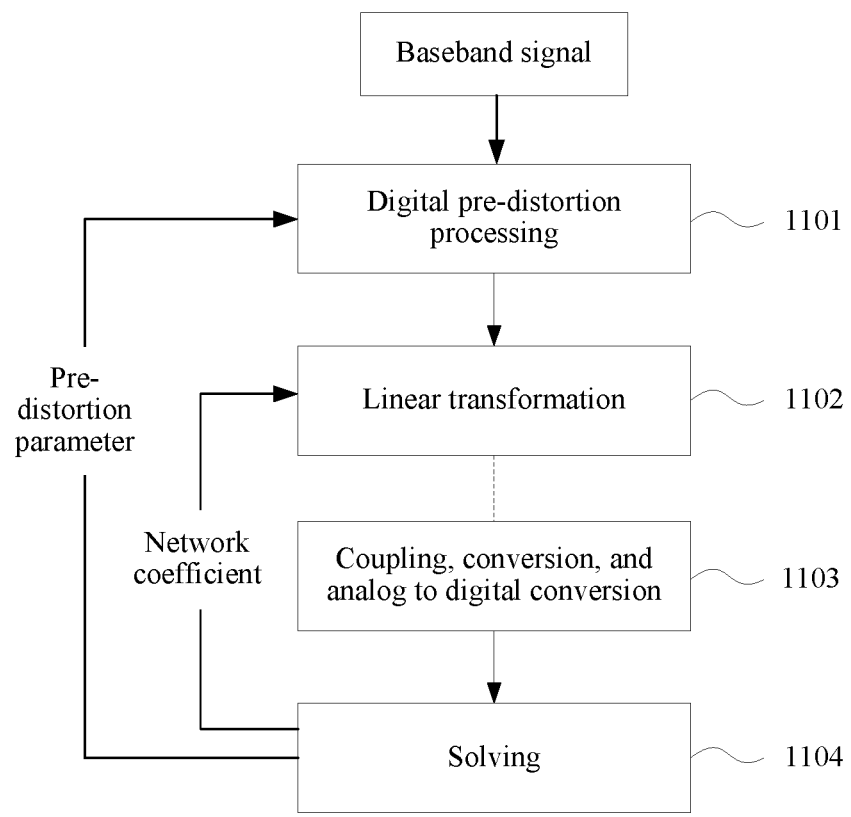
FIG. 11 is a flowchart of a first pre-distortion processing method according to an embodiment of this application.

FIG. 11 is a flowchart of a first pre-distortion processing method according to an embodiment of this application. The first pre-distortion processing method is a method corresponding to the first pre-distortion processing apparatus, that is, the first pre-distortion processing apparatus is a possible implementation of the first pre-distortion processing method.

In step 1101, digital pre-distortion processing is performed on a first baseband signal based on N sets of pre-distortion parameters to obtain N second baseband signals.

The first baseband signal is the same as the first baseband signal described in the pre-distortion processing apparatus corresponding to FIG. 4, and details are not described herein again.

Digital pre-distortion processing is performed on the first baseband signal based on the N sets of pre-distortion parameters by using any one of the following four processing methods, to obtain the N second baseband signals. One of the N second baseband signals may be referred to as an $x^{th}$ second baseband signal in the N second baseband signals, where x is an integer, and a value of x ranges from 1 to N.

A first processing method in the four processing methods is: x is an integer, and a value of x ranges from 1 to N; when x is 1, performing digital pre-distortion processing on the first baseband signal based on an $x^{th}$ set of pre-distortion parameters in the N sets of pre-distortion parameters to obtain the $x^{th}$ second baseband signal in the N second baseband signals; or when x is any integer from 2 to N, performing digital pre-distortion processing on an $(x-1)^{th}$ second baseband signal in the N second baseband signals based on an $x^{th}$ set of pre-distortion parameters in the N sets of pre-distortion parameters to obtain the $x^{th}$ second baseband signal in the N second baseband signals.

A second processing method in the four processing methods is: x is an integer, and a value of x ranges from 1 to N; when x is any integer from 1 to N, performing digital pre-distortion processing on an $x^{th}$ input signal in N input signals based on an $x^{th}$ set of pre-distortion parameters in the N sets of pre-distortion parameters to obtain an $x^{th}$ output signal in N output signals, where when x is 1, the $x^{th}$ input signal is the first baseband signal; or when x is any integer from 2 to N, the $x^{th}$ input signal is an $(x-1)^{th}$ output signal in the N output signals; and when x is any integer from 1 to N−1, multiplying the $x^{th}$ output signal by an $(x+1)^{th}$ output signal in the N output signals to obtain the $x^{th}$ second baseband signal in the N second baseband signals; or when x is N, determining that the $x^{th}$ output signal in the N output signals is the $x^{th}$ second baseband signal in the N second baseband signals.

A third processing method in the four processing methods is: x is an integer, and a value of x ranges from 1 to N; when x is any integer from 1 to N, performing digital pre-distortion processing on an $x^{th}$ input signal in N input signals based on an $x^{th}$ set of pre-distortion parameters in the N sets of pre-distortion parameters to obtain an $x^{th}$ output signal in N output signals, where the $x^{th}$ input signal is the first baseband signal; and when x is any integer from 1 to N−1, adding the $x^{th}$ output signal and an $(x+1)^{th}$ output signal in the N output signals to obtain the $x^{th}$ second baseband signal in the N second baseband signals; or when x is N, determining that the $x^{th}$ output signal in the N output signals is the $x^{th}$ second baseband signal in the N second baseband signals.

A fourth processing method in the four processing methods is: x is an integer, and a value of x ranges from 1 to N; when x is any integer from 1 to N, performing digital pre-distortion processing on an $x^{th}$ input signal in N input signals based on an $x^{th}$ set of pre-distortion parameters in the N sets of pre-distortion parameters to obtain the $x^{th}$ second baseband signal in the N second baseband signals, where when x is 1 or 2, the $x^{th}$ input signal is the first baseband signal, or when x is any integer from 2 to N, the $x^{th}$ input signal is a signal obtained by adding a $(2p-1)^{th}$ output signal and a $2p^{th}$ output signal in the N output signals, where p is a value obtained by rounding $((x-2)/2)$ up to the next integer.

In step 1102, M third baseband signals are determined based on the N second baseband signals and a network coefficient.

Linear transformation is performed on the N second baseband signals based on the network coefficient to obtain a $t^{th}$ third baseband signal in the M third baseband signals, where t is an integer, a value of t ranges from 1 to M, and the linear transformation includes multiplication and addition.

In step 1103, a fifth baseband signal is obtained based on R radio frequency signals amplified by power amplifiers.

The R radio frequency signals amplified by the power amplifiers are radio frequency signals determined based on the M third baseband signals described in step 1102. Analog to digital conversion is performed on the M third baseband signals to obtain M fourth baseband signals, that is, analog to digital conversion is performed on the $t^{th}$ third baseband signal in the M third baseband signals to obtain a $t^{th}$ fourth baseband signal in the M fourth baseband signals. Up-conversion is performed on the M fourth baseband signals based on a carrier signal to obtain M first radio frequency signals, that is, up-conversion is performed on the $t^{th}$ fourth baseband signal in the M fourth baseband signals based on the carrier signal to obtain a $t^{th}$ first radio frequency signal in the M first radio frequency signals. Power amplification is performed on the M first radio frequency signals to obtain M second radio frequency signals amplified by the power amplifiers, that is, power amplification is performed on the $t^{th}$ first radio frequency signal in the M first radio frequency signals to obtain a $t^{th}$ second radio frequency signal in the M second radio frequency signals amplified by the power amplifiers, where t is an integer, and a value of t ranges from 1 to M. The R radio frequency signals amplified by the power amplifiers in this step are R second radio frequency signals in the M second radio frequency signals, that is, coupling is performed based on the M second radio frequency signals to obtain the R radio frequency signals amplified by the power amplifiers, where R is an integer greater than or equal to 1 and less than or equal to M.

The fifth baseband signal may be obtained by using either of the following two methods based on the R second radio frequency signals amplified by the power amplifiers.

A first method in the two methods is: obtaining one output signal based on the R second radio frequency signals amplified by the power amplifiers, performing down-conversion on the output signal based on the carrier signal to obtain a sixth baseband signal, and performing analog to digital conversion on the sixth baseband signal to obtain the fifth baseband signal. In embodiments of this application, the carrier signal is a carrier signal used for performing frequency mixing on a baseband signal or a radio frequency signal, a radio frequency signal may be obtained by performing up-conversion on a baseband signal based on a carrier signal, and a baseband signal may be obtained by performing down-conversion on the radio frequency signal based on a carrier signal.

A second method in the two methods is: obtaining one output signal based on the R second radio frequency signals amplified by the power amplifiers, performing down-conversion on the output signal based on the carrier signal to obtain a sixth baseband signal, performing amplitude limiting processing on the sixth baseband signal to obtain a seventh baseband signal, and performing analog to digital conversion on the seventh baseband signal to obtain the fifth baseband signal.

In step 1104, the N sets of pre-distortion parameters and the network coefficient are determined based on the fifth baseband signal.

A plurality sets of pre-distortion parameter solving algorithms are combined in a serial manner, a parallel manner, or a serial manner plus a parallel manner to obtain a solving algorithm. The N sets of pre-distortion parameters described in step 1101 and the network coefficient described in step 1102 are determined based on the fifth baseband signal and the solving algorithm. A pre-distortion parameter solving algorithm is the same as corresponding descriptions in the pre-distortion processing apparatus corresponding to FIG. 4 or FIG. 5, and details are not described herein again.

Figure 12:
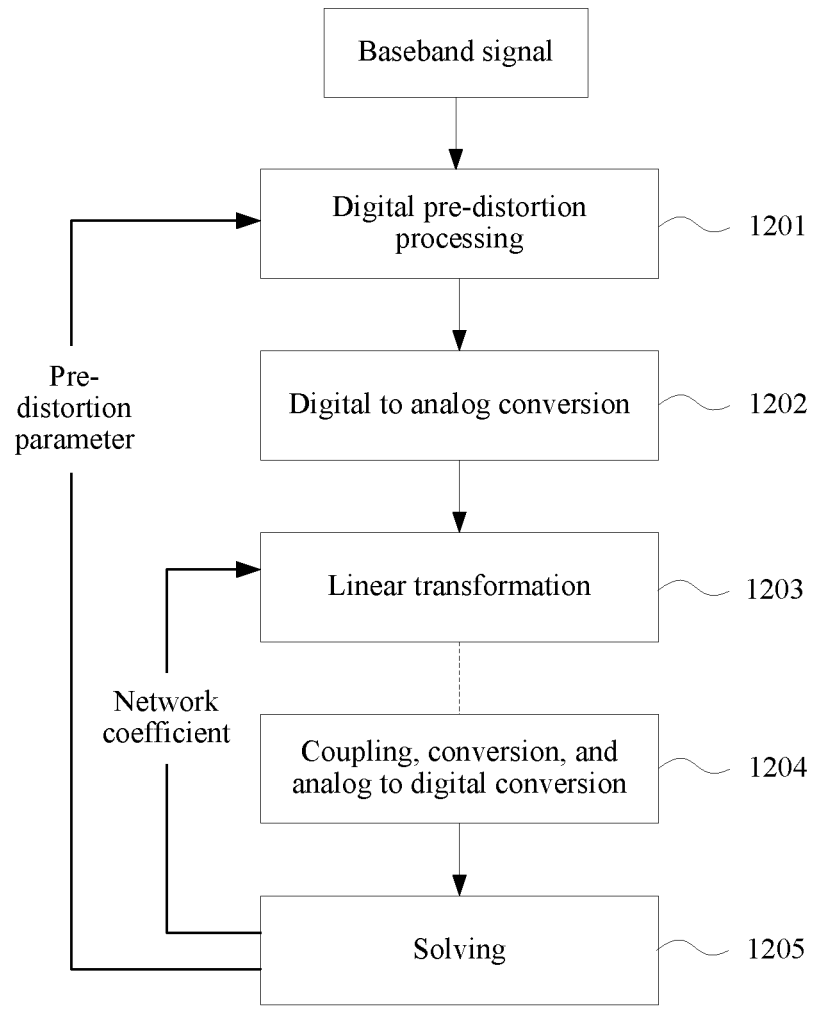
FIG. 12 is a flowchart of a second pre-distortion processing method according to an embodiment of this application.

FIG. 12 is a flowchart of a second digital pre-distortion processing method according to an embodiment of this application. The second pre-distortion processing method is a method corresponding to the second pre-distortion processing apparatus, that is, the second pre-distortion processing apparatus is a possible implementation of the second pre-distortion processing method.

In step 1201, digital pre-distortion processing is performed on a first baseband signal based on N sets of pre-distortion parameters to obtain N second baseband signals.

Step 1201 is the same as step 1101 in the method corresponding to FIG. 11.

In step 1202, digital to analog conversion is performed on the N second baseband signals to obtain N third baseband signals.

Digital to analog conversion is performed on an $x^{th}$ second baseband signal in the N second baseband signals to obtain an $x^{th}$ third baseband signal in the N third baseband signals, where x is an integer, and a value of x ranges from 1 to N.

In step 1203, M fourth baseband signals are obtained based on the N third baseband signals and a network coefficient.

Linear transformation is performed on the N third baseband signals based on the network coefficient to obtain a $t^{th}$ fourth baseband signal in the M fourth baseband signals, where t is an integer, a value of t ranges from 1 to M, and the linear transformation includes multiplication and addition.

In step 1204, a fifth baseband signal is determined based on R radio frequency signals amplified by power amplifiers.

The R radio frequency signals amplified by the power amplifiers are radio frequency signals determined based on the M fourth baseband signals described in step 1203. Up-conversion is performed on the M fourth baseband signals based on a carrier signal to obtain M first radio frequency signals, that is, up-conversion is performed on the $t^{th}$ fourth baseband signal in the M fourth baseband signals based on the carrier signal to obtain a $t^{th}$ first radio frequency signal in the M first radio frequency signals. Power amplification is performed on the M first radio frequency signals to obtain M second radio frequency signals amplified by the power amplifiers, that is, power amplification is performed on the $t^{th}$ first radio frequency signal in the M first radio frequency signals to obtain a $t^{th}$ second radio frequency signal in the M second radio frequency signals amplified by the power amplifiers, where t is an integer, and a value of t ranges from 1 to M. The R radio frequency signals amplified by the power amplifiers in this step are R second radio frequency signals in the M second radio frequency signals, that is, coupling is performed based on the M second radio frequency signals to obtain the R radio frequency signals amplified by the power amplifiers, where R is an integer greater than or equal to 1 and less than or equal to M.

The method for obtaining the fifth baseband signal based on the R radio frequency signals amplified by the power amplifiers is the same as corresponding descriptions in step 1103 corresponding to FIG. 11.

In step 1205, the N sets of pre-distortion parameters and the network coefficient are determined based on the fifth baseband signal.

Step 1205 is the same as step 1104 in the method corresponding to FIG. 11.

An apparatus for performing the digital pre-distortion processing method provided in the embodiments of this application may be a pre-distortion processing apparatus, for example, the pre-distortion processing apparatuses shown in FIG. 4 to FIG. 10, or may be another apparatus in a system or a network device, for example, a digital processing apparatus and/or an intermediate radio frequency processing apparatus. Optionally, the apparatus for performing the pre-distortion processing method provided in the embodiments of this application may further include a memory, configured to store a program instruction of the apparatus, or a program instruction and data of the apparatus. The memory includes a volatile memory such as a random-access memory (RAM), or the memory may include a non-volatile memory such as a flash memory, a hard disk drive (HDD), or a solid-state drive (SSD), or the memory may include a combination of the foregoing types of memories.

All or some of the foregoing embodiments may be implemented by using software, hardware, firmware, or any combination thereof. When software is used to implement the embodiments, the embodiments may be all or partially implemented in a form of a computer program product. The computer program product includes one or more computer instructions. When the computer program instruction is loaded and executed on a computer, the procedures or functions according to the embodiments of the present invention are all or partially generated. The computer may be a general-purpose computer, a special-purpose computer, a computer network, a network device, user equipment, or another programmable apparatus. The computer instruction may be stored in a computer-readable storage medium or may be transmitted from a computer-readable storage medium to another computer-readable storage medium. For example, the computer instruction may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any available medium accessible by a computer, or a data storage device, such as a server or a data center, integrating one or more available media. The available medium may be a magnetic medium (for example, a floppy disk, a hard disk, or a magnetic tape), an optical medium (for example, a digital video disc (DVD), a semiconductor medium (for example, an SSD), or the like.

The objectives, technical solutions, and beneficial effects of this application are further described in detail in the foregoing specific implementations. It should be understood that the foregoing descriptions are merely specific implementations of this application, but are not intended to limit the protection scope of this application. Any modification, equivalent replacement, or improvement made based on the technical solutions of this application shall fall within the protection scope of this application.

The invention claimed is:

1. An apparatus, comprising a first pre-distortion part, at least one digital to analog converter (DAC), a second pre-distortion part, a feedback signal conversion part, and a solving part, wherein:
   the first pre-distortion part comprises N digital pre-distortion (DPD) processors, and is configured to:
     receive a first baseband signal and N sets of pre-distortion parameters;
     perform digital pre-distortion processing on the first baseband signal based on the N DPD processors and the N sets of pre-distortion parameters to obtain N second baseband signals; and
     send the N second baseband signals to the at least one DAC;
   the at least one DAC is configured to:
     perform digital to analog conversion on the N second baseband signals to obtain N third baseband signals; and
     send the N third baseband signals to the second pre-distortion part;
   the second pre-distortion part is configured to:

receive the N third baseband signals and a network coefficient; and determine M fourth baseband signals based on the N third baseband signals and the network coefficient;

the feedback signal conversion part is configured to:

receive R radio frequency signals amplified by power amplifiers, wherein the R radio frequency signals amplified by the power amplifiers are radio frequency signals obtained based on the M fourth baseband signals;

convert, into a fifth baseband signal, the R radio frequency signals amplified by the power amplifiers; and send the fifth baseband signal to the solving part; and the solving part is configured to:

receive the first baseband signal and the fifth baseband signal;

determine the N sets of pre-distortion parameters and the network coefficient based on the first baseband signal and the fifth baseband signal;

send the N sets of pre-distortion parameters to the first pre-distortion part; and send the network coefficient to the second pre-distortion part, wherein N, M, and R are integers, N is greater than or equal to 1, M is greater than or equal to N, and R is greater than or equal to 1 and less than or equal to M.

2. The apparatus according to claim 1, wherein an $x^{th}$ DPD processor in the N DPD processors is configured to:

receive an $x^{th}$ set of pre-distortion parameters in the N sets of pre-distortion parameters and an $x^{th}$ DPD processor input signal;

perform digital pre-distortion processing on the $x^{th}$ DPD processor input signal based on the $x^{th}$ set of pre-distortion parameters to obtain an $x^{th}$ second baseband signal in the N second baseband signals; and send the $x^{th}$ second baseband signal to one DAC in the at least one DAC, wherein x is an integer, and a value of x ranges from 1 to N; and wherein:

when x is 1, the $x^{th}$ DPD processor input signal is the first baseband signal; or when x is any one of 2 to N, the $x^{th}$ DPD processor input signal is an $(x-1)^{th}$ second baseband signal sent by an $(x-1)^{th}$ DPD processor in the N DPD processors, and the $(x-1)^{th}$ second baseband signal is an $(x-1)^{th}$ second baseband signal in the N second baseband signals.

3. The apparatus according to claim 1, wherein the first pre-distortion part further comprises N−1 multipliers;

wherein an $x^{th}$ DPD processor in the N DPD processors is configured to:

receive an $x^{th}$ set of pre-distortion parameters in the N sets of pre-distortion parameters and an $x^{th}$ DPD processor input signal in N DPD processor input signals; and perform digital pre-distortion processing on the $x^{th}$ DPD processor input signal based on the $x^{th}$ set of pre-distortion parameters to obtain an $x^{th}$ DPD processor output signal in N DPD processor output signals, wherein x is an integer, a value of x ranges from 1 to N, and when x is 1, the $x^{th}$ DPD processor input signal is the first baseband signal, or when x is any one of 2 to N, the $x^{th}$ DPD processor input signal is an $(x-1)^{th}$ DPD processor output signal sent by an $(x-1)^{th}$ DPD processor in the N DPD processors, and the $(x-1)^{th}$ DPD processor output signal is an $(x-1)^{th}$ DPD processor output signal in the N DPD processor output signals;

wherein a $y^{th}$ multiplier in the N−1 multipliers is configured to:

receive a $y^{th}$ DPD processor output signal sent by a $y^{th}$ DPD processor in the N DPD processors and a $(y+1)^{th}$ DPD processor output signal sent by a $(y+1)^{th}$ DPD processor in the N DPD processors;

multiply the $y^{th}$ DPD processor output signal by the $(y+1)^{th}$ DPD processor output signal to obtain a $y^{th}$ second baseband signal in the N second baseband signals; and send the $y^{th}$ second baseband signal to one DAC in the at least one DAC, wherein the $y^{th}$ DPD processor output signal is a $y^{th}$ DPD processor output signal in the N DPD processor output signals, the $(y+1)^{th}$ DPD processor output signal is a $(y+1)^{th}$ DPD processor output signal in the N DPD processor output signals, y is an integer, and a value of y ranges from 1 to N−1; and wherein when x is N, the $x^{th}$ DPD processor output signal is an $x^{th}$ second baseband signal in the N second baseband signals, and the $x^{th}$ DPD processor is further configured to send the $x^{th}$ second baseband signal to one DAC in the at least one DAC.

4. The apparatus according to claim 1, wherein the first pre-distortion part further comprises N−1 adders;

wherein an $x^{th}$ DPD processor in the N DPD processors is configured to:

receive an $x^{th}$ set of pre-distortion parameters in the N sets of pre-distortion parameters and the first baseband signal; and perform digital pre-distortion processing on the first baseband signal based on the $x^{th}$ set of pre-distortion parameters to obtain an $x^{th}$ DPD processor output signal in N DPD processor output signals, wherein x is an integer, and a value of x ranges from 1 to N;

wherein a $y^{th}$ adder in the N−1 adders is configured to:

receive a $y^{th}$ DPD processor output signal sent by a $y^{th}$ DPD processor in the N DPD processors and a $(y+1)^{th}$ DPD processor output signal sent by a $(y+1)^{th}$ DPD processor in the N DPD processors;

add the $y^{th}$ DPD processor output signal and the $(y+1)^{th}$ DPD processor output signal to obtain a $y^{th}$ second baseband signal in the N second baseband signals; and send the $y^{th}$ second baseband signal to one DAC in the at least one DAC, wherein the $y^{th}$ DPD processor output signal is a $y^{th}$ DPD processor output signal in the N DPD processor output signals, the $(y+1)^{th}$ DPD processor output signal is a $(y+1)^{th}$ DPD processor output signal in the N DPD processor output signals, y is an integer, and a value of y ranges from 1 to N−1; and wherein when x is N, the $x^{th}$ DPD processor output signal is an $x^{th}$ second baseband signal in the N second baseband signals, and the $x^{th}$ DPD processor is further configured to send the $x^{th}$ second baseband signal to one DAC in the at least one DAC.

5. The apparatus according to claim 1, wherein the first pre-distortion part further comprises L adders, wherein L is a value obtained by rounding $((N-2)/2)$ up to the next integer;

wherein an $x^{th}$ DPD processor in the N DPD processors is configured to:

receive an $x^{th}$ set of pre-distortion parameters in the N sets of pre-distortion parameters and an $x^{th}$ DPD processor input signal in N DPD processor input signals;

perform digital pre-distortion processing on the $x^{th}$ DPD processor input signal based on the $x^{th}$ set of pre-distortion parameters to obtain an $x^{th}$ second baseband signal in the N second baseband signals; and send the $x^{th}$ second baseband signal to one DAC in the at least one DAC, wherein x is an integer, and a value of x ranges from 1 to N;

wherein a $p^{th}$ adder in the L adders is configured to:
receive a $(2p-1)^{th}$ second baseband signal sent by a $(2p-1)^{th}$ DPD processor in the N DPD processors and a $2p^{th}$ second baseband signal sent by a $2p^{th}$ DPD processor in the N DPD processors;
add the $(2p-1)^{th}$ second baseband signal and the $2p^{th}$ second baseband signal to obtain a $(2p+1)^{th}$ DPD processor input signal and a $(2p+2)^{th}$ DPD processor input signal in the N DPD processor input signals; and
send the $(2p+1)^{th}$ DPD processor input signal and the $(2p+2)^{th}$ DPD processor input signal to a $(2p+1)^{th}$ DPD processor and a $(2p+2)^{th}$ DPD processor in the N DPD processors, wherein the $(2p-1)^{th}$ second baseband signal is a $(2p-1)^{th}$ second baseband signal in the N second baseband signals, the $2p^{th}$ second baseband signal is a $2p^{th}$ second baseband signal in the N second baseband signals, p is an integer, and a value of p ranges from 1 to L−1; and wherein:

L is a multiple of 2, and an $L^{th}$ adder in the L adders is configured to:
receive a $(2L-1)^{th}$ second baseband signal sent by a $(2L-1)^{th}$ DPD processor in the N DPD processors and a $2L^{th}$ second baseband signal sent by a $2L^{th}$ DPD processor in the N DPD processors;
add the $(2L-1)^{th}$ second baseband signal and the $2L^{th}$ second baseband signal to obtain a $(2L+1)^{th}$ DPD processor input signal and a $(2L+2)^{th}$ DPD processor input signal in the N DPD processor input signals; and
send the $(2L+1)^{th}$ DPD processor input signal and the $(2L+_2)^{th}$ DPD processor input signal to a $(2L+1)^{th}$ DPD processor and a $(2L+_2)^{th}$ DPD processor in the N DPD processors; or L is not a multiple of 2, and an $L^{th}$ adder in the L adders is configured to:
receive a $(2L-1)^{th}$ second baseband signal sent by a $(2L-1)^{th}$ DPD processor in the N DPD processors and a $2L^{th}$ second baseband signal sent by a $2L^{th}$ DPD processor in the N DPD processors;
add the $(2L-1)^{th}$ second baseband signal and the $2L^{th}$ second baseband signal to obtain a $(2L+1)^{th}$ DPD processor input signal in the N DPD processor input signals; and
send the $(2L+1)^{th}$ DPD processor input signal to a $(2L+1)^{th}$ DPD processor in the N DPD processors, wherein the $(2L-1)^{th}$ second baseband signal is a $(2L-1)^{th}$ second baseband signal in the N second baseband signals, the $2L^{th}$ second baseband signal is a $2L^{th}$ second baseband signal in the N second baseband signals, and when x is 1 or 2, the first baseband signal is the $x^{th}$ DPD processor input signal.

6. The apparatus according to claim 1, wherein the second pre-distortion part comprises W signal determining parts; and
wherein an $e^{th}$ signal determining part in the W signal determining parts is configured to:
receive the N third baseband signals and the network coefficient, and
determine an $e^{th}$ second pre-distortion part output signal based on the N third baseband signals and the network coefficient, wherein the $e^{th}$ second pre-distortion part output signal corresponds to at least one of the M fourth baseband signals, wherein e is an integer, and wherein a value of e ranges from 1 to W.

7. The apparatus according to claim 1, wherein the feedback signal conversion part comprises a coupling part, a frequency mixing part, and an analog to digital converter (ADC);
wherein the coupling part is configured to:
receive the R radio frequency signals amplified by the power amplifiers;
obtain one coupling part output signal based on the R radio frequency signals amplified by the power amplifiers; and
send the coupling part output signal to the frequency mixing part;
wherein the frequency mixing part is configured to:
receive a carrier signal and the coupling part output signal;
perform down-conversion on the coupling part output signal based on the carrier signal to obtain a sixth baseband signal; and
send the sixth baseband signal to the ADC; and
wherein the ADC is configured to:
perform analog to digital conversion on the sixth baseband signal to obtain the fifth baseband signal; and
send the fifth baseband signal to the solving part.

8. The apparatus according to claim 1, wherein the feedback signal conversion part comprises a coupling part, a frequency mixing part, a clipper, and an ADC;
wherein the coupling part is configured to:
receive the R radio frequency signals amplified by the power amplifiers;
obtain one coupling part output signal based on the R radio frequency signals amplified by the power amplifiers; and
send the coupling part output signal to the frequency mixing part;
wherein the frequency mixing part is configured to:
receive a carrier signal and the coupling part output signal;
perform down-conversion on the coupling part output signal based on the carrier signal to obtain a sixth baseband signal; and
send the sixth baseband signal to the clipper;
wherein the clipper is configured to:
perform amplitude limiting processing on the sixth baseband signal to obtain a seventh baseband signal; and
send the seventh baseband signal to the ADC; and
wherein the ADC is configured to:
perform analog to digital conversion on the seventh baseband signal to obtain the fifth baseband signal; and
send the fifth baseband signal to the solving part.

9. The apparatus according to claim 1, wherein the apparatus further comprises an oscillator and M frequency mixing parts;
wherein the second pre-distortion part is further configured to send a $t^{th}$ fourth baseband signal in the M fourth baseband signals to a $t^{th}$ frequency mixing part in the M frequency mixing parts;
wherein the oscillator is configured to:

generate a carrier signal and
send the carrier signal to the M frequency mixing parts; and wherein the $t^{th}$ frequency mixing part in the M frequency mixing parts is configured to perform up-conversion on the $t^{th}$ fourth baseband signal based on the carrier signal to obtain a $t^{th}$ first radio frequency signal in M first radio frequency signals, wherein t is an integer, and wherein a value of t ranges from 1 to M.

10. The apparatus according to claim 7, wherein the apparatus further comprises an oscillator and M frequency mixing parts;

wherein the second pre-distortion part is further configured to send a $t^{th}$ fourth baseband signal in the M fourth baseband signals to a $t^{th}$ frequency mixing part in the M frequency mixing parts;

wherein the oscillator is configured to:
generate a carrier signal; and
send the carrier signal to the M frequency mixing parts and the frequency mixing part that is comprised in the feedback signal conversion part; and wherein the $t^{th}$ frequency mixing part in the M frequency mixing parts is configured to perform up-conversion on the $t^{th}$ fourth baseband signal based on the carrier signal to obtain a $t^{th}$ first radio frequency signal in M first radio frequency signals, wherein t is an integer, and wherein a value of t ranges from 1 to M.

11. The apparatus according to claim 9, wherein the apparatus further comprises M power amplifiers PAs;

wherein the $t^{th}$ frequency mixing part in the M frequency mixing parts is further configured to send the $t^{th}$ first radio frequency signal in the M first radio frequency signals to a $t^{th}$ PA in the M PAs; and wherein the $t^{th}$ PA in the M PAs is configured to:
amplify the $t^{th}$ first radio frequency signal to obtain a $t^{th}$ second radio frequency signal in M second radio frequency signals; and
send the t second radio frequency signal to the feedback signal conversion part, wherein the $t^{th}$ second radio frequency signal is used as one radio frequency signal amplified by a power amplifier in the R radio frequency signals that are amplified by the power amplifiers and that are received by the feedback signal conversion part, wherein t is an integer, and wherein a value of t ranges from 1 to M.

12. The apparatus according to claim 11, wherein the apparatus further comprises M antennas, wherein M is an integer;

wherein the $t^{th}$ PA in the M PAs is further configured to send the $t^{th}$ second radio frequency signal to a t antenna in the M antennas; and wherein the $t^{th}$ antenna in the M antennas is configured to send the $t^{th}$ second radio frequency signal on an air interface, wherein t is an integer, and wherein a value of t ranges from 1 to M.

13. A method, comprising:
performing digital pre-distortion processing on a first baseband signal based on N sets of pre-distortion parameters to obtain N second baseband signals;
performing digital to analog conversion on the N second baseband signals to obtain N third baseband signals;
determining M fourth baseband signals based on the N third baseband signals and a network coefficient;
determining a fifth baseband signal based on R radio frequency signals amplified by power amplifiers, wherein the R radio frequency signals amplified by the power amplifiers are determined based on the M fourth baseband signals; and
determining the N sets of pre-distortion parameters and the network coefficient based on the first baseband signal and the fifth baseband signal, wherein N, M, and R are integers, N is greater than or equal to 1, M is greater than or equal to N, and R is greater than or equal to 1 and less than or equal to M.

14. The method according to claim 13, wherein the performing digital pre-distortion processing on a first baseband signal based on N sets of pre-distortion parameters to obtain N second baseband signals comprises:

x is an integer, and a value of x ranges from 1 to N;
when x is 1, performing digital pre-distortion processing on the first baseband signal based on an $x^{th}$ set of pre-distortion parameters in the N sets of pre-distortion parameters to obtain an $x^{th}$ second baseband signal in the N second baseband signals; or
when x is any integer from 2 to N, performing digital pre-distortion processing on an $(x-1)^{th}$ second baseband signal in the N second baseband signals based on an $x^{th}$ set of pre-distortion parameters in the N sets of pre-distortion parameters to obtain an $x^{th}$ second baseband signal in the N second baseband signals.

15. The method according to claim 13, wherein the performing digital pre-distortion processing on a first baseband signal based on N sets of pre-distortion parameters to obtain N second baseband signals comprises:

x is an integer, and a value of x ranges from 1 to N;
when x is any integer from 1 to N, performing digital pre-distortion processing on an $x^{th}$ input signal in N input signals based on an $x^{th}$ set of pre-distortion parameters in the N sets of pre-distortion parameters to obtain an $x^{th}$ output signal in N output signals, wherein when x is 1, the $x^{th}$ input signal is the first baseband signal, or when x is any integer from 2 to N, the $x^{th}$ input signal is an $(x-1)^{th}$ output signal in the N output signals; and
when x is any integer from 1 to N−1, multiplying the $x^{th}$ output signal by an $(x+1)^{th}$ output signal in the N output signals to obtain an $x^{th}$ second baseband signal in the N second baseband signals; or
when x is N, determining that the $x^{th}$ output signal in the N output signals is an $x^{th}$ second baseband signal in the N second baseband signals.

16. The method according to claim 13, wherein the performing digital pre-distortion processing on a first baseband signal based on N sets of pre-distortion parameters to obtain N second baseband signals comprises:

x is an integer, and a value of x ranges from 1 to N;
when x is any integer from 1 to N, performing digital pre-distortion processing on an $x^{th}$ input signal in N input signals based on an $x^{th}$ set of pre-distortion parameters in the N sets of pre-distortion parameters to obtain an $x^{th}$ output signal in N output signals, wherein the $x^{th}$ input signal is the first baseband signal; and
when x is any integer from 1 to N−1, adding the $x^{th}$ output signal and an $(x+1)^{th}$ output signal in the N output signals to obtain an $x^{th}$ second baseband signal in the N second baseband signals; or
when x is N, determining that the $x^{th}$ output signal in the N output signals is an $x^{th}$ second baseband signal in the N second baseband signals.

17. The method according to claim 13, wherein the performing digital pre-distortion processing on a first baseband signal based on N sets of pre-distortion parameters to obtain N second baseband signals comprises:

x is an integer, and a value of x ranges from 1 to N;

when x is any integer from 1 to N, performing digital pre-distortion processing on an $x^{th}$ input signal in N input signals based on an $x^{th}$ set of pre-distortion parameters in the N sets of pre-distortion parameters to obtain an x second baseband signal in the N second baseband signals, wherein:

when x is 1 or 2, the $x^{th}$ input signal is the first baseband signal; or when x is any integer from 2 to N, the $x^{th}$ input signal is a signal obtained by adding a $(2p-1)^{th}$ output signal and a $2p^{th}$ output signal in the N output signals, wherein p is equal to a value obtained by rounding $((x-2)/2)$ up to the next integer.

18. The method according to claim 13, wherein the determining M fourth baseband signals based on the N third baseband signals and a network coefficient comprises:

determining a $t^{th}$ fourth baseband signal in the M fourth baseband signals based on the N third baseband signals and the network coefficient, wherein t is an integer, and a value of t ranges from 1 to M.

19. The method according to claim 13, wherein the method further comprises:

performing up-conversion on the M fourth baseband signals based on a carrier signal to obtain M first radio frequency signals; and performing power amplification on the M first radio frequency signals to obtain M radio frequency signals amplified by the power amplifiers, wherein the R radio frequency signals amplified by the power amplifiers are R radio frequency signals in the M radio frequency signals amplified by the power amplifiers.

20. A pre-distortion processing apparatus, comprising a first pre-distortion part, a second pre-distortion part, a feedback signal conversion part, and a solving part, wherein:

the first pre-distortion part comprises N digital pre-distortion (DPD) processors, and is configured to:
receive a first baseband signal and N sets of pre-distortion parameters;
perform digital pre-distortion processing on the first baseband signal based on the N sets of pre-distortion parameters to obtain N second baseband signals; and
send the N second baseband signals to the second pre-distortion part;

the second pre-distortion part is configured to:
receive the N second baseband signals and a network coefficient; and
determine M third baseband signals based on the N second baseband signals and the network coefficient;

the feedback signal conversion part is configured to:
receive R radio frequency signals amplified by power amplifiers, wherein the R radio frequency signals amplified by the power amplifiers are radio frequency signals obtained based on the M third baseband signals;
convert, into a fifth baseband signal, the R radio frequency signals amplified by the power amplifiers; and
send the fifth baseband signal to the solving part; and the solving part is configured to:
receive the first baseband signal and the fifth baseband signal;
determine the N sets of pre-distortion parameters and the network coefficient based on the first baseband signal and the fifth baseband signal;
send the N sets of pre-distortion parameters to the first pre-distortion part; and
send the network coefficient to the second pre-distortion part, wherein N, M, and R are integers, N is greater than 1, M is greater than or equal to N, and R is greater than 1 and less than or equal to M.

\* \* \* \* \*